US 6,537,416 B1

(12) United States Patent
Mayer et al.

(10) Patent No.: US 6,537,416 B1
(45) Date of Patent: Mar. 25, 2003

(54) WAFER CHUCK FOR USE IN EDGE BEVEL REMOVAL OF COPPER FROM SILICON WAFERS

(75) Inventors: Steven T. Mayer, Lake Oswego, OR (US); Steve Taatjes, Sherwood, OR (US); Andy McCutcheon, Vancouver, WA (US); Jim Schall, Malalla, OR (US); Jinbin Feng, Tigard, OR (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/558,249

(22) Filed: Apr. 25, 2000

Related U.S. Application Data
(60) Provisional application No. 60/157,254, filed on Oct. 1, 1999.

(51) Int. Cl.[7] .................................................. C23F 1/00
(52) U.S. Cl. .................... 156/345.17; 156/345.21; 156/345.22; 118/729; 118/730
(58) Field of Search ................. 156/345.17, 345.21, 156/345.22, 345.54; 118/729, 730

(56) References Cited

U.S. PATENT DOCUMENTS

| | | | | |
|---|---|---|---|---|
| 4,313,266 A | * | 2/1982 | Tam | 34/8 |
| 4,788,994 A | * | 12/1988 | Shinbara | 134/157 |
| 5,486,234 A | | 1/1996 | Contolini et al. | |
| 5,810,940 A | | 9/1998 | Fukazawa et al. | |
| 5,882,433 A | * | 3/1999 | Ueno | 134/31 |
| 6,167,893 B1 | * | 1/2001 | Taatjes et al. | 134/147 |
| 6,217,034 B1 | * | 4/2001 | Smedt et al. | 279/106 |
| 6,309,981 B1 | * | 10/2001 | Mayer et al. | 438/754 |
| 6,333,275 B1 | * | 12/2001 | Mayer et al. | 438/745 |

FOREIGN PATENT DOCUMENTS

| | | | |
|---|---|---|---|
| JP | 04-135110 | * | 5/1992 |
| JP | 04-186626 | * | 7/1992 |

* cited by examiner

Primary Examiner—George Goudreau
(74) Attorney, Agent, or Firm—Beyer Weaver & Thomas, LLP

(57) ABSTRACT

A wafer chuck includes alignment members that allows a semiconductor wafer to be properly aligned on the chuck without using a separate alignment stage. The alignment members may be cams, for example, attached to arms of the wafer chuck. These members may assume an alignment position when a robot arm places the wafer on the chuck. In this position, they guide the wafer into a proper alignment position with respect to the chuck. During rotation at a particular rotational speed, the alignment members move away from the wafer to allow liquid etchant to flow over the entire edge region of the wafer. At still higher rotational speeds, the wafer is clamped into position to prevent it from flying off the chuck. A clamping cam or other device (such as the alignment member itself) may provide the clamping.

28 Claims, 15 Drawing Sheets

WAFER CHUCK FOR USE IN EDGE BEVEL REMOVAL OF COPPER FROM SILICON WAFERS

CROSS-REFERENCE TO RELATED APPLICATIONS

This application claims priority under 35 U.S.C. §119(e) from now abandoned U.S. Provisional Patent Application No. 60/157,254, filed Oct. 1, 1999, naming S. Mayer et al. as inventors, and titled "METHOD, MATERIALS AND APPARATUS FOR EDGE BEVEL REMOVAL OF COPPER FROM SILICON WAFERS." This application is also related to U.S. Pat. No. 6,309,981 filed on the same day as the instant application, naming Mayer et al. as inventors, and titled "EDGE BEVEL REMOVAL OF COPPER FROM SILICON WAFERS" and U.S. Pat. No. 6,333,275 filed on the same day as the instant application, naming Mayer et al. as inventors, and titled "ETCHANT MIXING SYSTEM FOR EDGE BEVEL REMOVAL OF COPPER FROM SILICON WAFERS." The provisional patent application as well as the regular U.S. applications referenced above are hereby incorporated by reference in their entireties and for all purposes.

BACKGROUND OF THE INVENTION

This invention relates to technology for removing unwanted metal from semiconductor wafers. More particularly, the invention pertains to wafer chucks used in metal etching modules to align, rotate and clamp the semiconductor wafer while etchant is applied. The modules used to perform the metal etch are typically edge bevel removal (EBR) modules specifically designed to perform the metal etch or integrated electrofill modules that are used to perform both metal deposition and etching.

Damascene processing is a method for forming metal lines on integrated circuits. It is often a preferred method because it requires fewer processing steps than other methods and offers a higher yield. In Damascene processing, as well as other integrated circuit manufacturing processes, the conductive routes on the surface of the circuit are generally formed out of a common metal, traditionally aluminum. Copper is a favored metal because of its higher conductivity and electromigration resistance when compared to aluminum, but copper presents special challenges because it readily diffuses into silicon oxide and reduces its electrical resistance at very low doping levels. During integrated circuit fabrication, conductive metal is needed on the active circuit region of the wafer, i.e., the main interior region on the front side, but is undesirable elsewhere. In a typical copper Damascene process, the formation of the desired conductive routes generally begins with a thin physical vapor deposition (PVD) of the metal, followed by a thicker electrofill layer (which is formed by electroplating). The PVD process is typically sputtering. In order to maximize the size of the wafer's useable area (sometimes referred to herein as the "active surface region") and thereby maximize the number of integrated circuits produced per wafer), the electrofilled metal must be deposited to very near the edge of the semiconductor wafer. Thus, it is necessary to allow physical vapor deposition of the metal over the entire front side of the wafer. As a byproduct of this process step, PVD metal typically coats the front edge area outside the active circuit region, as well as the side edge, and to some degree, the backside. Electrofill of the metal is much easier to control, since the electroplating apparatus can be designed to exclude the electroplating solution from undesired areas such as the edge and backside of the wafer. One example of plating apparatus that constrains electroplating solution to the wafer active surface is the SABRE™ clamshell electroplating apparatus available from Novellus Systems, Inc. of San Jose, Calif. and described in U.S. patent application Ser. No. 08/969,984, "CLAMSHELL APPARATUS FOR ELECTROCHEMICALLY TREATING SEMICONDUCTOR WAFERS," naming E. Patton et al. as inventors, and filed Nov. 13, 1997, which is herein incorporated by reference in its entirety.

The PVD metal remaining on the wafer edge after electrofill is undesirable for various reasons. One reason is that PVD metal layers are thin and tend to flake off during subsequent handling, thus generating undesirable particles. This can be understood as follows. At the front side edge of the wafer, the wafer surface is beveled. Here the PVD layers are not only thin, but also unevenly deposited. Thus, they do not adhere well. Adhesion of subsequent dielectric layers onto such thin metal is also poor, thus introducing the possibility of even more particle generation. By contrast the PVD metal on the active interior region of the wafer is simply covered with thick, even electrofill metal and planarized by CMP down to the dielectric. This flat surface, which is mostly dielectric, is then covered with a barrier layer substance such as SiN that both adheres well to the dielectric and aids in the adhesion of subsequent layers. Another reason to remove the residual PVD metal layers in the wafer edge area is that the barrier layers underneath them are also thin and uneven, which may allow migration of the metal into the dielectric. This problem is especially important when the metal is copper.

To address these problems, semiconductor equipment may have to allow etching of the unwanted residual metal layers. Various difficulties will be encountered in designing a suitable etching system.

One such difficulty involves the design of wafer chucks that hold the semiconductor wafer during the metal etch. First, the system must align the wafer on chuck for rotation. Conventionally, such alignment is done by placing the wafer in a separate alignment module and then transporting it the chuck. Unfortunately, this approach involves a separate alignment step that can add expense and affect IC throughput. Further, the wafer chuck should not contact the wafer edges during the actual etching of unwanted metal from those regions. Otherwise, the viscous etchant would not be able flow over the side edge of the wafer unimpeded. Still further, the chuck should be able to clamp the wafer during high-speed rotation (e.g., greater than 750 rpm), such as is typically used in drying operations. The chuck must be made of materials that are resistant to the etching properties of the etchant. The chuck should also be designed to facilitate wetting and rinsing operations, and to allow unimpeded application of the etchant to the backside of the wafer.

For these reasons, an improved wafer chuck design is required for etching unwanted metal from semiconductor wafers.

SUMMARY OF THE INVENTION

The present invention provides wafer chucks designed to solve the above-described problems, among others. Such wafer chucks may include alignment members that allow the wafer to be properly aligned on the chuck without using a separate alignment stage. The alignment members may be cams, for example, attached to arms of the wafer chuck. These members may assume an alignment position when a robot arm places the wafer on the chuck. In this position, they guide the wafer into a proper alignment position with respect to the chuck. During rotation at a particular rotational speed, the alignment members move away from the wafer to allow liquid etchant to flow over the entire edge region of the wafer. At still higher rotational speeds, the wafer is clamped into position to prevent it from flying off the chuck. A clamping cam or other device (such as the alignment member itself) may provide the clamping. While the wafer chuck is described in the context of EBR modules, similar designs may be employed with other types of semiconductor processing modules. It is obvious to one of ordinary skill in the art that various specifications, alignment and clamping timings/rotational speeds can be modified to adapt the wafer chuck of the present invention to other semiconductor wafer processes.

One aspect of the invention provides for a wafer chuck with alignment members and clamping members on the ends of chuck arms. The wafer sits on support pins on the chuck arms. When the chuck is at low rotational speed (below EBR speed) or at rest, the alignment members are in an inward, alignment position that keeps the wafer aligned by contacting its edge. Above a certain rotational speed, the alignment members move away from the edge of the wafer, thus allowing the EBR etchant to flow over the edge of the wafer unimpeded. At these speeds, the clamping members are in an outward, non-clamping position. At still higher rotational speeds (e.g., drying speeds), the clamping members move inward to clamp the wafer by contacting its edge. The invention provides for alignment and clamping members that are cams. The cams will typically be designed so that they will automatically move inward or outward about pivot pins, based on the direction of the centripetal force on the cams.

An alignment member and a clamping member can be placed on the same chuck arm, so that one sits inside the other, though the manner of their operation is essentially the same as in the above-described aspect. The clamping member can be designed with a cross-member to help constrain the alignment member to its alignment position. In an alternative embodiment, a pneumatic mechanism can also be used to align and clamp the wafer. The pneumatic mechanism keeps the wafer in alignment while it is at rest or at low rotational speed by constraining it with alignment pins. The pneumatic mechanism then retracts at EBR speeds to allow the etchant to flow over the edge of the wafer. The pneumatic mechanism clamps the wafer at higher rotational speeds (drying speeds) by again contacting the edge of the wafer with the alignment pins.

Another aspect of the invention provides for a method of removing metal from a semiconductor wafer by aligning the wafer in a rotatable chuck of an etching module, aligning and rotating the wafer, performing the metal etch, and clamping down the wafer during rotation at higher speeds (e.g., for drying). The method can be practiced in a stand-alone etching module, or in an integrated module that is designed to do both metal deposition and etching. The metal that is involved is typically copper. The method is practiced with alignment members that align the wafer by contacting its edge, and clamping members that clamp the wafer by contacting its edge.

Another aspect of the invention provides for pre-aligning a semiconductor wafer using a pre-alignment module or pre-alignment section of the etching module, so that the semiconductor wafer is attached at a precise position on a robot arm. The robot arm can then be moved to a predetermined precise position in an etching module, at which time the wafer is released, thus placing it in precise alignment within the etching module.

These and other features and advantages of the present invention will be described in more detail below with reference to the associated drawings.

DETAILED DESCRIPTION OF THE PREFERRED EMBODIMENTS

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

As indicated, this invention pertains to removal of unwanted copper metal from an edge bevel region of a semiconductor wafer. A "semiconductor wafer" as referred to in this invention is a semiconductor substrate at any of the various states of manufacture in the production of integrated circuits. One standard semiconductor wafer described in this invention is 200 mm in diameter, 0.75 mm thick, with an approximate radius of curvature of about 0.15 millimeters (see SEMI Specification M1-0298). Of course, semiconductor wafers of other dimensions, such as a standard 300 mm diameter silicon wafers, can also be processed in accordance with this invention. Note that standard specifications for a 300 mm diameter wafer maybe found in SEMI Specification M1.15-0997.

Figure 1A:
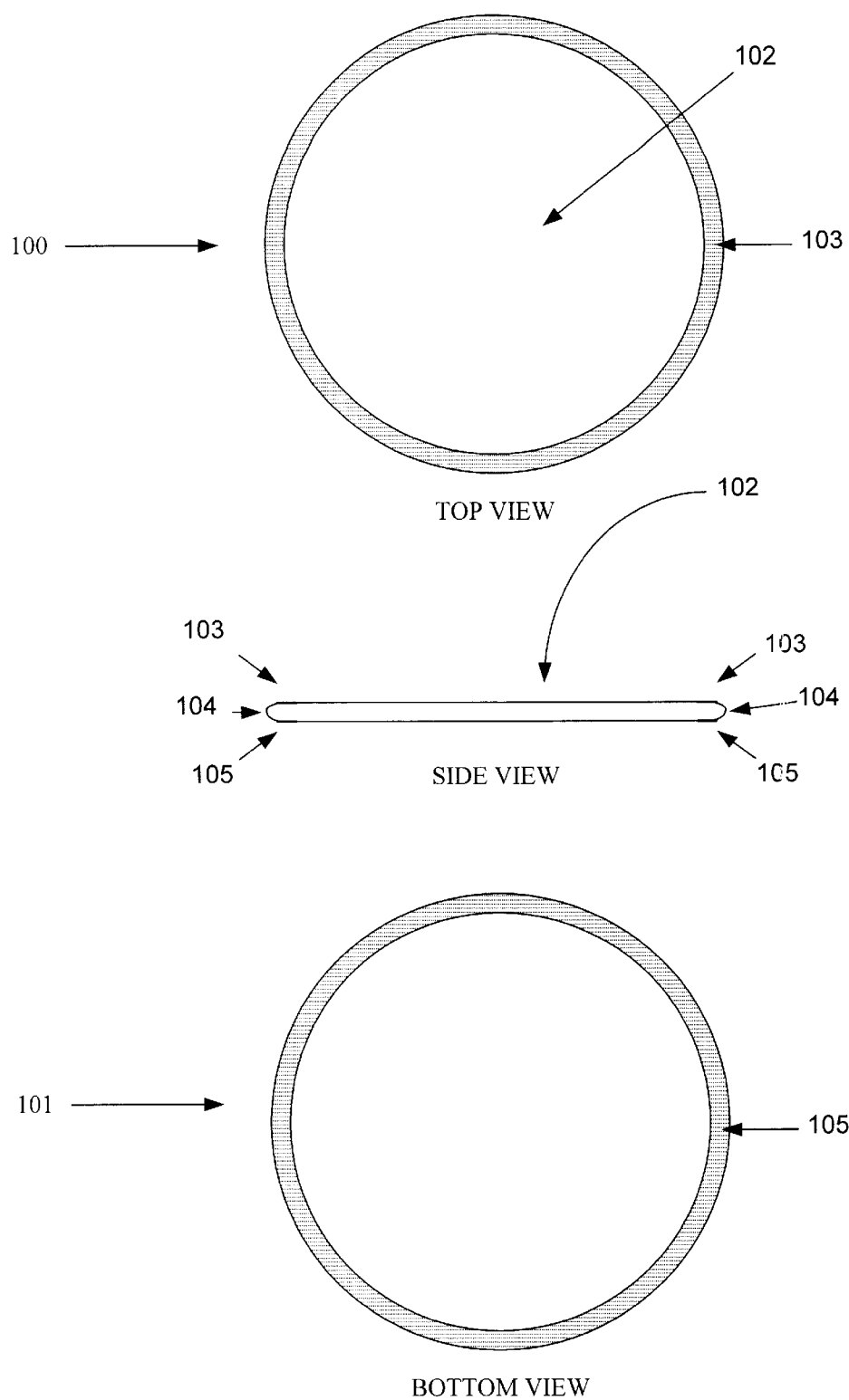
FIG. 1A is an illustration of a semiconductor wafer showing the location of the edge bevel region that is etched in accordance with this invention.

To facilitate understanding the concepts of this invention, a schematic illustration of a semiconductor wafer is shown in FIG. 1A. As shown, such semiconductor wafer has a top or "front" side 100 and a "backside" 101. The wafer also has an interior "active circuit region" 102 where integrated circuit devices with associated conductive metal routes are formed. To make maximum use of expensive semiconductor material, this active circuit region should constitute a high fraction of the area on the front side 100 of the wafer. With a 200 mm wafer, the present invention allows the interior active surface region to extend the useable active region to within at least 1.5 and 4 mm of the outer boundary of the wafer. As shown, integrated circuit wafers also include a "front edge" area 103, which is the region on the front of the wafer that lies outside the active circuit region, a "side edge" area 104 (sometimes referred to herein as an "edge bevel region") and a "back edge" area 105. The side edge lies in the area between the front side and the backside, and the back edge is roughly the area near the outer boundary of the wafer on its backside, approximately analogous to the front edge area. Unwanted metal such as copper may deposit on regions 103, 104, and 105. Some metal may also deposit over the entire backside 101. One use of the present invention is to remove unwanted metal from these regions without substantially affecting metal deposited on active region 102.

A "post-electrofill module" (PEM) or "EBR module" as referred to in this invention is a module that is specifically designed to carry out the edge bevel removal (EBR) process, as well as a backside etch (BSE) process, in most cases. It may also perform processes ancillary to the EBR, including pre-rinsing, rinsing, acid washing and drying. An integrated-electrofill module as referred to in this invention is a module that carries out electrofill.

Figure 1B:
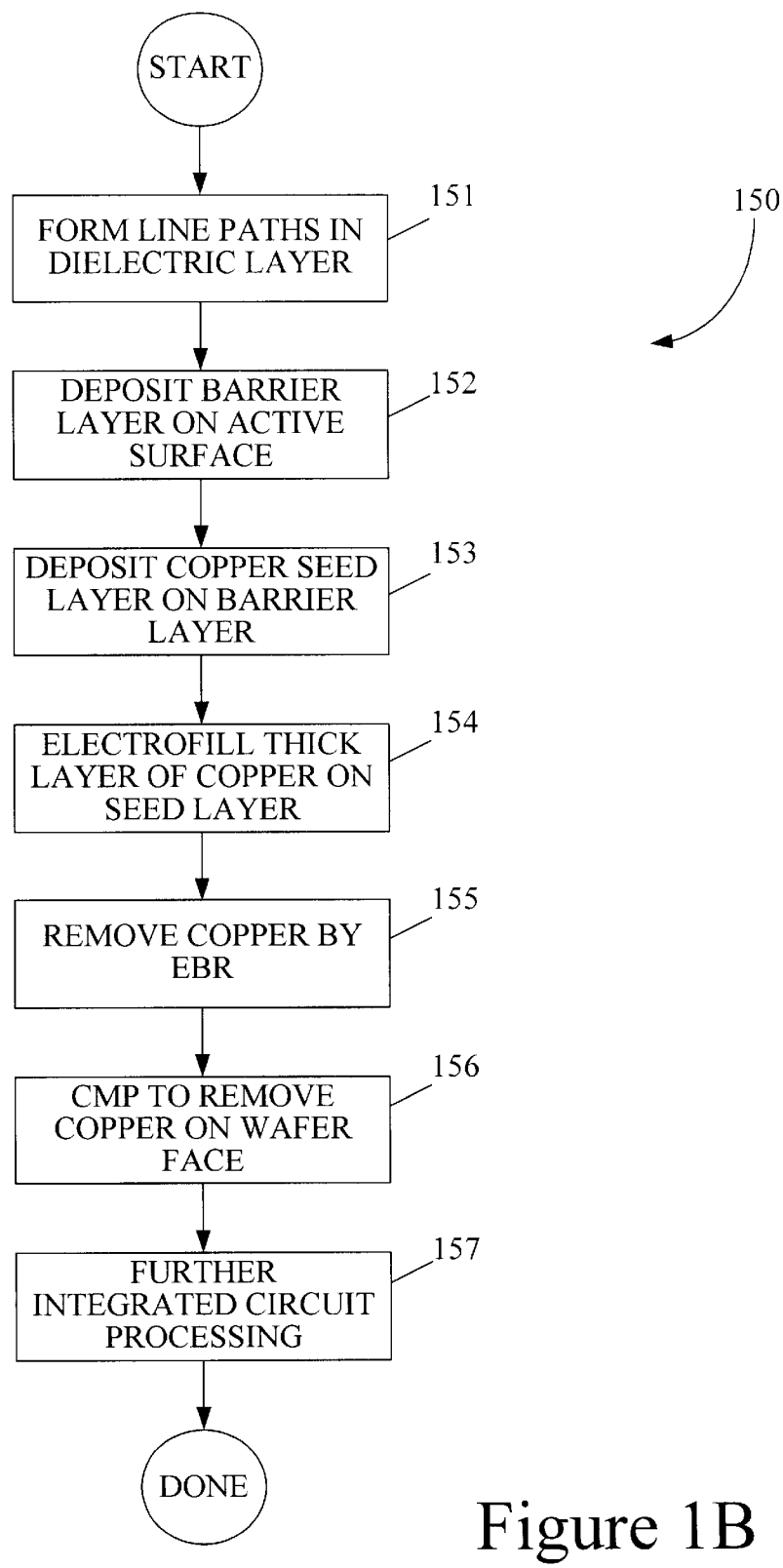
FIG. 1B is a process flow diagram illustrating relevant operations employed to form conductive copper lines a Damascene process in the context of this invention.

While details of the preferred embodiment may be found below in this application, a short description of a typical Damascene process will now be provided to facilitate understanding the context of the present invention. A typical Damascene process flow 150 is illustrated in the flowchart of FIG. 1B. Process 150 begins with formation of line paths 151 in a previously formed dielectric layer. These line paths may be etched as trenches and vias in a blanket layer of dielectric such as silicon dioxide. They define conductive routes between various devices on a semiconductor wafer. Because copper or other mobile conductive material provides the conductive paths of the semiconductor wafer, the underlying silicon devices must be protected from metal ions (e.g., copper) that might otherwise diffuse into the silicon. To accomplish this, the process includes depositing a thin diffusion barrier layer 152 before depositing the metal. Suitable materials for the diffusion barrier layer include tantalum, tantalum nitride, tungsten, titanium, and titanium tungsten. In a typical embodiment, the barrier layer is formed by a PVD process such as sputtering.

The wafer is now nearly ready to have its line paths inlayed with the electrofill copper. However, before electrofilling, a conductive surface coating must be applied. In the depicted process, this is accomplished by depositing a copper seed layer on the barrier layer at 153. A PVD process such as sputtering may be employed to this end. The wafer is then electrofilled at 154 with a thicker layer of copper over the seed layer, by electroplating using an electroplating solution. The copper is deposited to a thickness that completely fills the various line paths in the dielectric layer.

As mentioned, it is desirable to use as much of the wafer surface for active circuitry as possible. While it is generally a straightforward matter to shield unwanted areas from an electroplating solution, the same kind of shielding cannot be so easily and precisely done with PVD. Thus deposition of PVD copper in some unwanted areas cannot be avoided. This copper must be removed, and this is accomplished by the edge bevel removal (EBR) and/or backside etch BSE processes of the present invention.

With EBR at 155, a copper etchant is applied to the front edge of the wafer in a thin stream. The etchant is preferably applied under viscous flow conditions so that it remains in a thin, viscous layer near the point on the wafer where it is applied, and thus avoids splashing the interior of the wafer. Because the etchant is also generally applied with a radial velocity component, and because of the centripetal acceleration effects of the rotating wafer, the thin viscous layer flows outward, down over the side edge and a few millimeters onto the backside, thus accomplishing removal of the PVD copper from all three of these areas. More specifics of the EBR process are described below. After EBR, the electroplated copper is planarized, generally by chemical-mechanical polishing (CMP) down to the dielectric at 156 in preparation for further processing (illustrated at 157), generally the addition of subsequent dielectric and metalization layers.

Figure 1C:
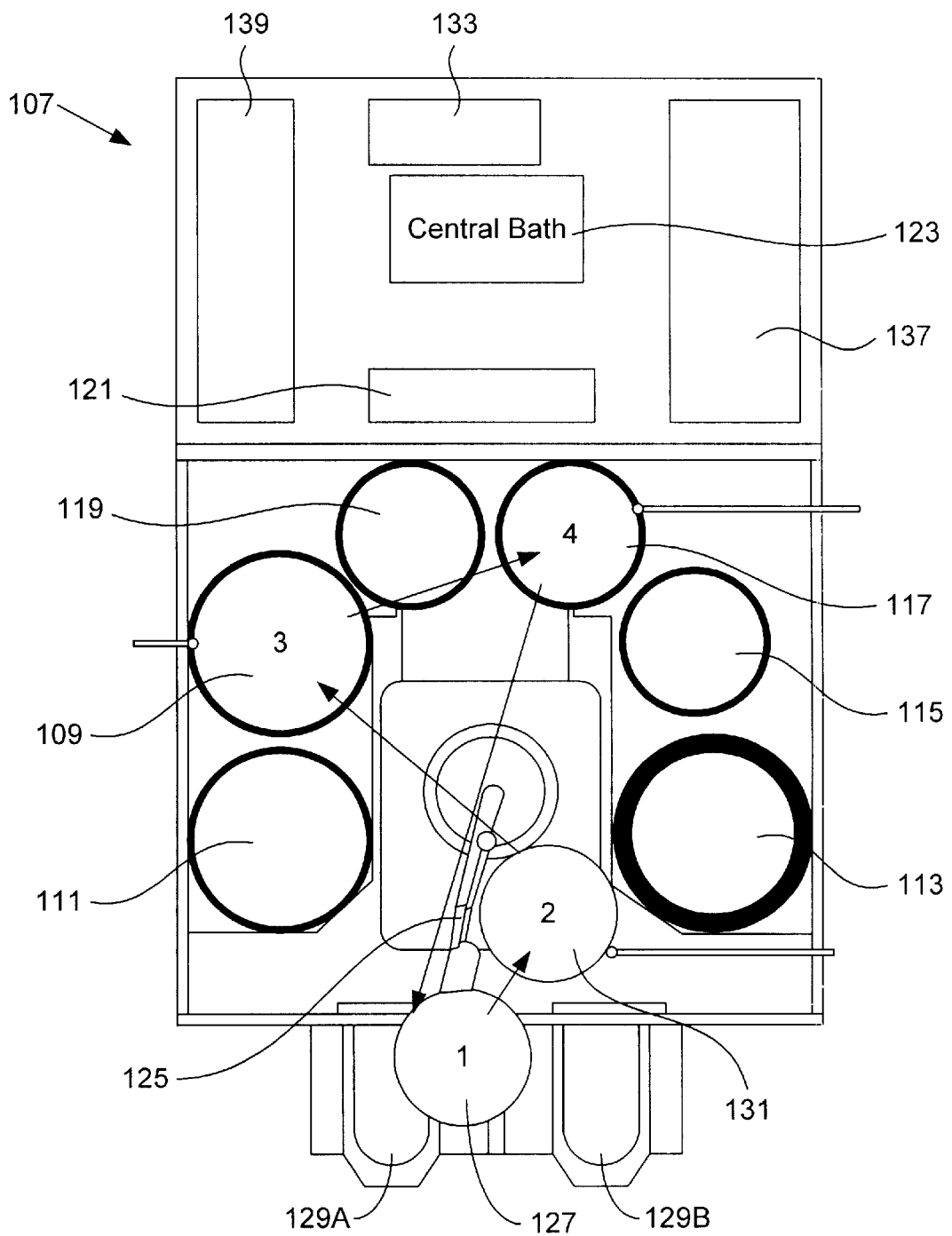
FIG. 1C is a block diagram illustrating a group of modules used to form copper conductive lines on an integrated circuit.

FIG. 1C depicts an electrofill system 107 in which the invention may reside. The specific system includes three separate electrofill modules 109, 111 and 113. System 107 also includes three separate post electrofill modules 115, 117 and 119. Each of these may be employed to perform each of the following functions: edge bevel removal, backside etching, and acid cleaning of wafers after they have been electrofilled by one of modules 109, 111, and 113. System 107 also includes a chemical dilution module 121 and a central electrofill bath 123. This is a tank that holds the chemical solution used as the electroplating bath in the electrofill modules. System 107 also includes a dosing system 133 that stores and delivers chemical additives for the plating bath. A chemical dilution module 135 stores and mixes chemicals to be used as the etchant in the post electrofill modules. A filtration and pumping unit 137 filters the plating solution for central bath 123 and pumps it to the electrofill modules. Finally, an electronics unit 139 provides the electronic and interface controls required to operate system 107. Unit 139 may also provide a power supply for the system.

In operation, a robot including a robot arm 125 selects wafers such as a wafer 127 from a wafer cassette such as a cassette 129A or a cassette 129B. Robot arm 125 may attach to wafer 127 using a vacuum attachment.

To ensure that wafer 127 is properly aligned on robot arm 125 for precision delivery to an electrofill module, robot arm 125 transports wafer 127 to an aligner 131. In a preferred embodiment, aligner 131 includes alignment arms against which robot arm 125 pushes wafer 127. When wafer 127 is properly aligned against the alignment arms, the robot arm 125 moves to a preset position with respect to the alignment arms. It then reattaches to wafer 127 and delivers it to one of the electrofill modules such as electrofill module 109. There, wafer 127 is electrofilled with copper metal. Electrofill module 109 employs electrolyte from a central bath 123.

After the electrofill operation completes, robot arm 125 removes wafer 127 from electrofill module 109 and transports it to one of the post-electrofill modules such as module 117. There unwanted copper from certain locations on the wafer (namely the edge bevel region and the backside) is etched away by an etchant solution provided by chemical dilution module 121.

Preferably wafer 127 is precisely aligned within post electrofill module 117 without making use of aligner 131. To this end, the post electrofill modules may be provided with an alignment chuck as referenced elsewhere herein. In alternative embodiment, wafer 127 is separately aligned within aligner 131 after electrofill and prior to edge bevel removal in module 117.

After processing in post electrofill module 117 is complete, robot arm 125 retrieves wafer 127 from the module and returns it to cassette 129A. From there the cassettes can be provided to other systems such as a chemical mechanical polishing system for further processing.

Figure 2A:
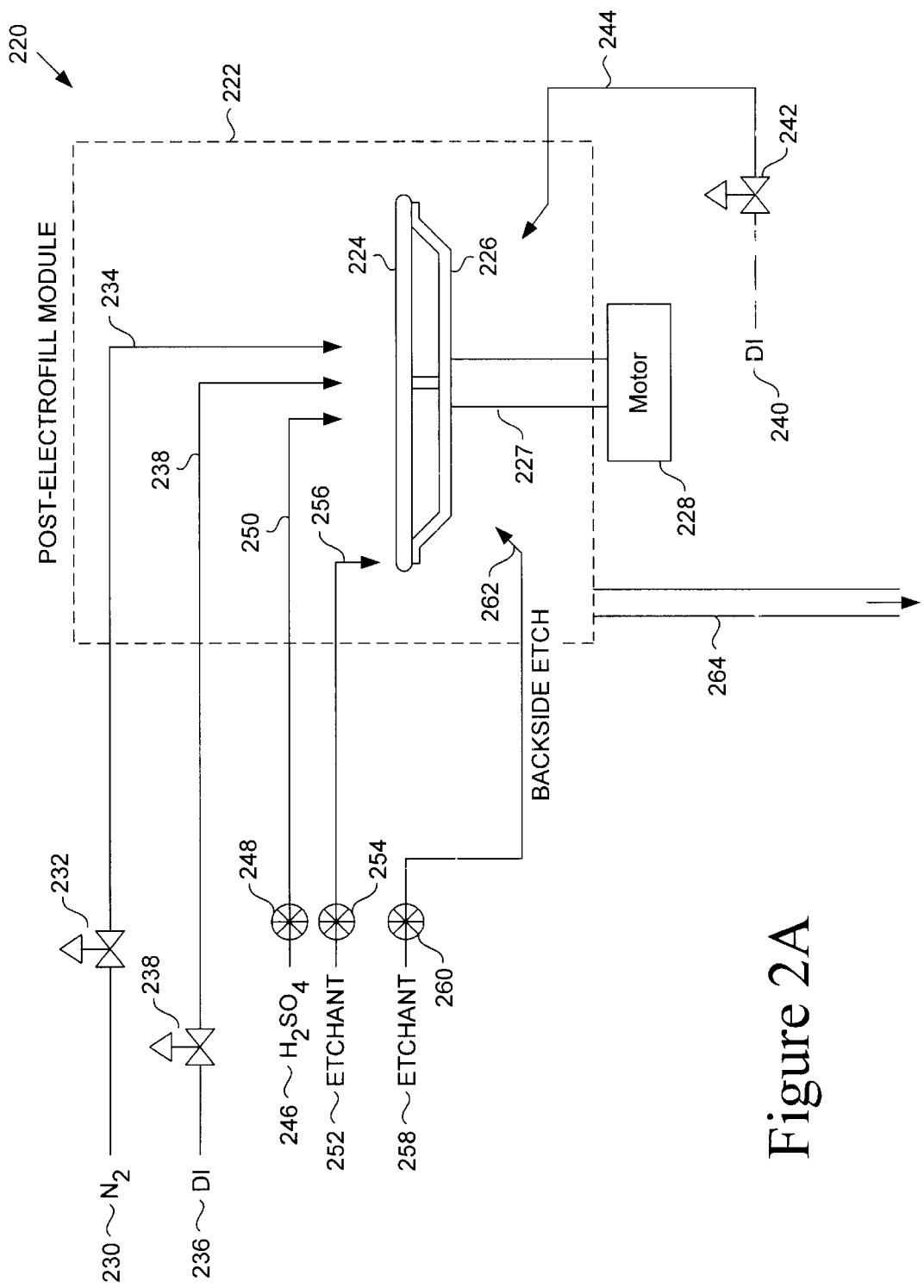
FIG. 2A is a block diagram illustrating various elements of a post-electrofill module in accordance with one embodiment of this invention.
Figure 3:
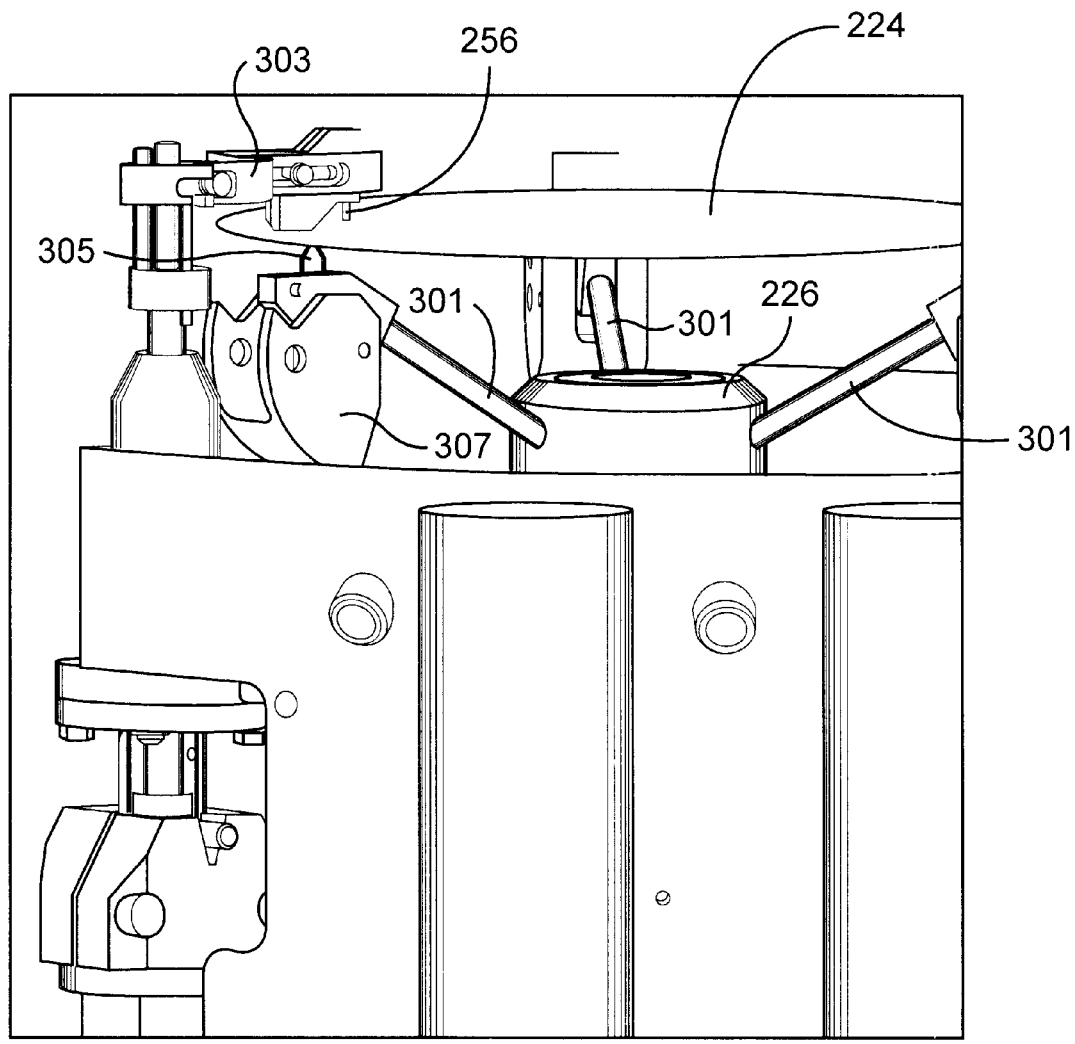
FIG. 3 is a perspective diagram of edge bevel removal components that may be employed in a post-electrofill module in accordance with one embodiment of this invention.

FIG. 2A schematically illustrates one preferred post-electrofill module 220 suitable for use with this invention. FIG. 3 presents such module in a perspective view. As shown, module 220 includes a chamber 222 in which a semiconductor wafer 224 rotates. Wafer 224 resides on a wafer chuck 226 which imparts rotational motion to wafer 224. Chamber 222 is outfitted with a drain and associated drain line 264. The drain allows the various liquid streams provided to chamber 222 to be removed for waste treatment.

A motor 228 controls the rotation of chuck 226. Motor 228 should be easy to control and should smoothly transition between various rotational speeds. It may reside within or without chamber 222. In some embodiments, to protect against damage from liquid etchant, motor 228 resides outside of chamber 222 and is separated therefrom by a seal through which a rotating shaft 227 passes. Any wobble in the shaft on rotation should be small (~<0.05 millimeters for example) so that the location of fluid nozzles with respect to the wafer does not vary substantially, nor shake the wafer from its center while it is not confined by alignment or clamping members. Preferably, motor 228 can rapidly accelerate and decelerate (in a controlled fashion) chuck 226 and wafer 225 at rotation rates between 0 and about 2000 rpm. The motor speed and other operations should be controllable by a computer.

Chuck 226 may be of any suitable design that holds wafer 224 in position during various rotational speeds. It may also facilitate alignment of wafer 224 for the etching process. A few particularly preferred examples of wafer chucks are described below.

Chamber 222 may be of any suitable design that confines the liquid etchant within its interior and allows delivery of the various fluids to wafer 224. It should be constructed of an etchant resistant material and include ports and nozzles for the various liquid and gaseous streams used during etching and cleaning.

Gaseous nitrogen is provided to post electrofill module 220 from a source of nitrogen 230. Preferably, this is a central source of nitrogen available to various processes throughout an integrated circuit manufacturing facility. Nitrogen from source 230 is delivered to chamber 222 under the control of a valve 232. The gaseous nitrogen is delivered into chamber 222 via a line and nozzle 234 positioned to deliver the nitrogen directly onto wafer 224, preferably at the center of the wafer. This enables blowing dry, particle-free nitrogen at the center, upper face of the wafer. This orientation of the nozzle increases the drying rate at the wafer center, where the centrifugal forces are small. Other suitable gas drying sub-systems may be employed as will be appreciated by those of skill in the art. For example, drying gases other than nitrogen may be employed in some embodiments. Also, the orientation and blowing direction of the nitrogen nozzle may be widely varied.

The next input of interest to module 220 is a source of deionized water 236. As with the source of nitrogen 230, the source of deionized water 236 preferably originates with a central source within an integrated circuit fabrication facility. The deionized water is delivered to chamber 222 under the control of a valve 238 and through a delivery line and nozzle 238. Note that line 238 directs deionized water onto the top of wafer 224. This enables rinsing of the wafer's top side. A preferred nozzle sprays fluid as a thin "fan" that spreads out over the inner three-quarters of the wafer diameter. Preferably, the thickness of the fan is no more than about one-fifth of the wafer diameter. The spray can impact the wafer with a velocity in the same direction as the wafer is rotating, or opposite the direction of rotation, or even in both directions if the spray fan crosses the wafer center. Preferably, the spray is directed opposite to the direction of rotation to increase convective mixing. Alternatively, a simple stream of deionized water can be directed at the center of the wafer (or any other location on the wafer).

A similar deionized water system provides a stream or fan of deionized water to the backside of wafer 224. This deionized water is provided from a source of deionized water 240, which may be the same as source 236. A valve 242 controls the flow of deionized water onto the backside of wafer 224 via a line and nozzle 244. The nozzle associated with 244 may have the same design criteria as just mentioned for nozzle 238. The goal is to rinse etchant from the backside of wafer 224.

In a preferred embodiment, an acid rinse is conducted on the front side of wafer 224. To this end, a source of sulfuric acid 246 provides sulfuric acid to a delivery line and nozzle 250. Other acids may be used as appropriate. Preferably, the source 246 of sulfuric acid is a chemical dilution module described in U.S. Pat. No. 6,333,275. Preferably, this module includes a valve that controls the delivery of sulfuric acid to module 220. The flow of sulfuric acid into chamber 222 may be monitored by a mass flow meter 248. Note that in the depicted embodiment nozzle 250 is oriented to direct sulfuric acid onto the center of the front side of wafer 224. After the acid is delivered to the center of the wafer it then spins out into the edge of the wafer during rotation. This solution is applied to remove residual copper oxide which remains after oxidizing (etching) the wafer and aids in the overall cleaning of the wafer. Only a relatively small amount of acid is typically required (e.g., 0.5 to 2 milliliters/200 mm wafer). After its application, the wafer's front side is rinsed with deionized water through nozzle 238.

Liquid etchant used to remove copper or other unwanted metal from portions of wafer 224 is provided from a source of liquid etchant 252 as shown. Preferably, this source is provided by the above-mentioned chemical dilution module. The etchant passes through a mass flow meter 254 and is delivered to wafer 224 via a line and nozzle 256. Preferably, the etchant is delivered to the edge bevel region of wafer 224 to remove PVD copper in that region.

A second liquid etchant stream may be delivered to the backside of wafer 224 in order to etch off any copper or other unwanted metal that may have been deposited on the backside of wafer 224. As shown, such etchant is delivered from an etchant source 258. Preferably, this is the same source as 252. In other words, the chemical dilution module provides etchant for both edge bevel removal and backside etch. As shown, etchant from source 258 passes through a mass flow meter 260 and through a nozzle 262, which directs it onto the backside of wafer 224.

Figure 2B:
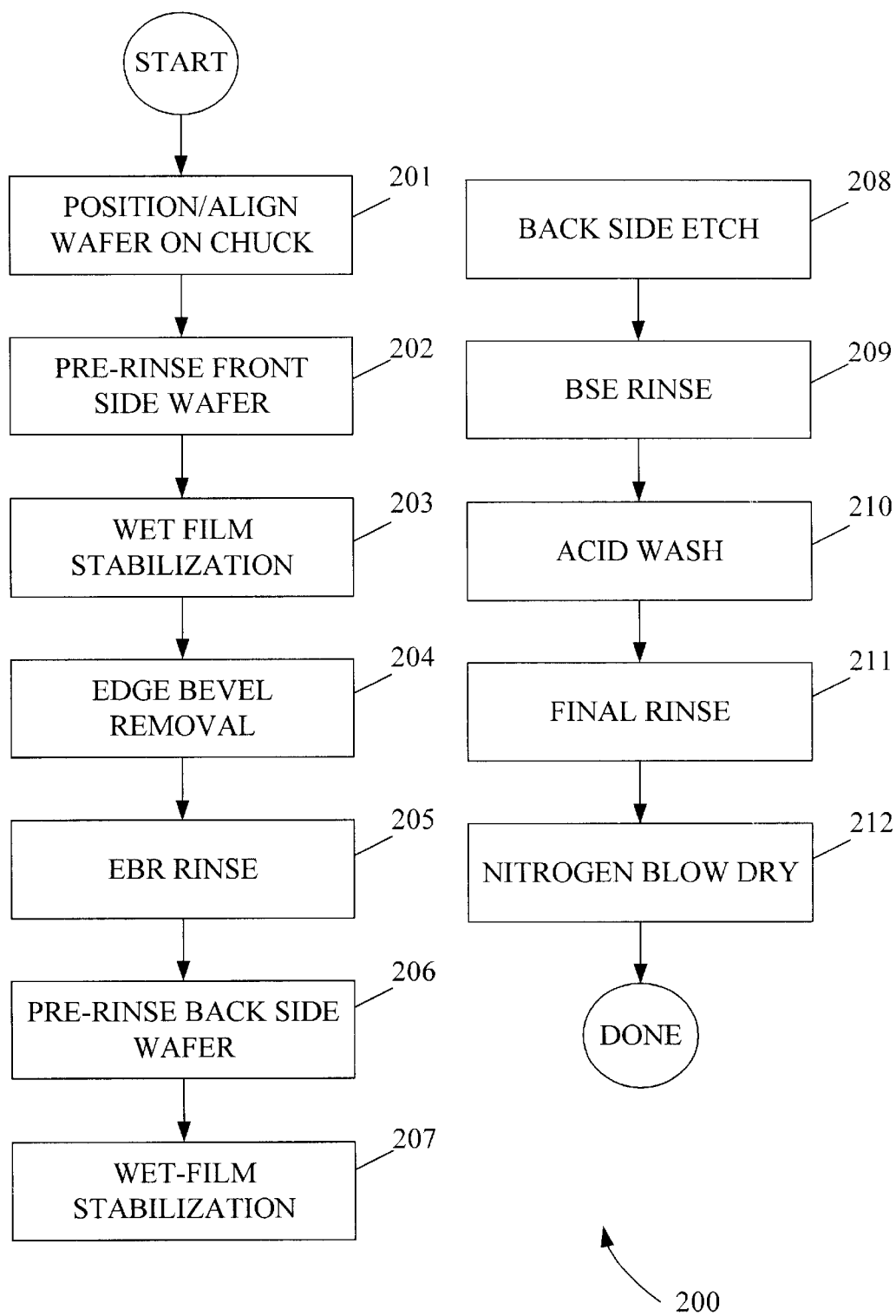
FIG. 2B is a process flow diagram illustrating a typical sequence of operations employed with a post-electrofill module in accordance with an embodiment of this invention.

A specific preferred embodiment of the EBR process is illustrated in FIG. 2B. The EBR process 200 can be carried out by a post-electrofill module, such as module 220 of FIG. 2A, that is specifically designed to carry out the EBR process. The process begins at 201, with a robot arm placing the wafer on the module chuck for EBR processing. The wafer is typically aligned and placed on a set of support pins that hold the wafer in place by static friction, even when the wafer is later rotated. After the robot arm retracts, deionized water is applied to the front of the wafer and the wafer is spun at about 200–400 rpm in order to pre-rinse the wafer of any particles and contaminants left over from previous steps. See 202. The deionized water is then turned off and the wafer is spun up to a speed of between about 350–500 rpm, which creates a uniformly thin layer of deionized water (wet-film stabilization). See 203. This wet-film stabilization facilitates an even distribution of the etchant over the front side of the wafer. At this time, at the latest, any alignment pins or clamps that were used to precisely align the wafer in the chuck are retracted from the edge of the wafer.

After wet-film stabilization 203, the core feature of the EBR, actual removal of the edge bevel metal 204 is performed. The EBR etchant is typically applied to the surface of the wafer using a thin nozzle tube, which has a nozzle opening at or near its end. When dispensing a small amount of fluid onto a surface as such, three flow regimes can generally result. The first regime is edge beading, where surface tension forces dominate the behavior of the fluid, the second is viscous flow, where viscous forces predominate, and the third is inertial, where inertial forces predominate and the fluid tends to spray. As explained below, the preferred flow regime is the viscous flow. In a specific example, an EBR dispense arm is positioned over the wafer edge as described below with reference to FIG. 4B. Then EBR is performed under the following conditions: a total of about 2 to 4 milliliters etchant is delivered at a rate of about 0.25 to 2 milliliters/second (more preferably about 0.5 to 1 milliliters/second) for a 200 millimeter wafer. A further discussion of the desired flow conditions will be presented below.

During EBR, some etchant may flow onto the backside of the wafer and etch it. An alternative embodiment for practicing the present invention is to have the wafer facing upside down, and to apply the etchant to the backside edge.

After the required amount of liquid etchant has been applied to the edge of the wafer, deionized water is again applied to the front side of the wafer as a post-EBR rinse 205. This application of deionized water will generally continue through the subsequent operations of backside etching and backside rinsing so as to protect the wafer from any extraneous backside etchant spray and damage. While the deionized water is applied, the dispense arm moves the etchant nozzle away from the wafer.

At generally about the same time as commencement of step 205, the backside of the wafer is pre-rinsed 206 with deionized water, which is wet-film stabilized 207 in much the same manner that the front side of the wafer was (e.g., the wafer rotation speed is held at about 350 to 500 rpm). After the flow of deionized water to the wafer backside ends, a backside etch operation 208 is performed—generally with the same etchant that was used for the EBR. In a specific embodiment, a thin jet (initially 0.02 to 0.04 inches in diameter) of liquid etchant is aimed at the center of the wafer backside. The etchant is preferably delivered from a tubular nozzle having a diameter of about 0.02 to 0.04 inches and a length of at least about 5 times the diameter. This etchant then disperses over the entire backside of the wafer. The purpose of the BSE is to remove any residual copper that was formed on the backside of the wafer during formation of the seed layer of PVD copper.

The BSE etchant is typically applied using a spray nozzle. Despite gravity, surface tension generally keeps the etchant in contact with the bottom of the wafer long enough to carry out BSE. Since the chuck arms could interfere with the spraying of etchant on the backside of the wafer, the angle of the spray nozzle may be varied during BSE to ensure thorough application of the etchant. Because the wafer is generally held up by support pins that impinge on the backside of the wafer, the process is generally carried out at two different speeds to ensure that the etchant flows adequately over the entire surface. For instance, the wafer may be rotated at about 350 rpm during part of the BSE and then rotated at 500–700 rpm for the remainder of the BSE. The portions of the backside blocked by the arms will differ at the two speeds, thus ensuring complete coverage. Overall, the BSE process typically takes 1–4 seconds and uses 1 to 5 cubic centimeters of the preferred etchant described below to reduce the concentration of copper on the backside to less than $5 \times 10^{-10}$ atoms per $cm^2$ of substrate.

After BSE, both sides of the wafer (or at least the backside of the wafer) are rinsed with deionized water to rinse any liquid etchant, particles and contaminants remaining from the BSE. See 209. Then the flow of deionized water to the front side ends and about 2 to 4 milliliters of a dilute acid, generally less than about 15% by weight acid, is applied to the front side of the wafer to remove residual metal oxide and remove the associated discoloration. See 211. In a specific embodiment, the acid is applied at a rate of about 2 cc/sec. After the acid rinse, deionized water is once again applied to both sides of the wafer, or at least the front side, to rinse the acid from the wafer. In a specific embodiment, the deionized water is applied for about 15–30 seconds at about 300–400 milliliters/min. Finally the wafer can be spun and blow-dried, as desired, on both sides with nitrogen. See 212. Generally, any drying step is carried out at about 750–2000 rpm for about 10 to 60 seconds, and necessitates a clamping for the wafer once it reaches about 750 rpm. Many embodiments for the clamping mechanism are possible, and some of these are discussed in more detail below. After this processing in the PEM is completed, a robot arm picks up the wafer and puts it in a cassette.

Turning again to FIGS. 2A and 3, some features of the PEM will be described in further detail. First, note that wafer 224 rides on support pins 305 (located on wafer chuck arms 301) by static friction. Preferably, the support pins 305 are located from about 5 to 20 millimeters, more preferably about 5 to 10 millimeters, in from the edge of wafer 224. The design of the support pins is determined by the need to supply enough friction to 1) keep the wafer from flying off the chuck if it is aligned slightly off center (i.e. when aligned to the tolerance of the specification of the edge bevel removal process), 2) not slip as the wafer is accelerated (at typically a rate of 50 to 300 rpm/sec (100 rpm/sec in a specific embodiment)) from rest to the EBR rotation rate, and 3) not shed or generate particles. As the wafer's rotational speed increases, however, it reaches a velocity at which the static friction from resting on the pins can no longer constrain it due to small misalignments and the associated centripetal force. To prevent the wafer from flying off chuck 226 at such velocities, clamping cams 307 may be employed. The design of suitable cams is described below. For now, simply understand that at defined wafer rotational velocities, the clamping cams rotate into a position that locks wafer 224 in place.

Next note that a dispense-arm 303 functions to hold the dispense nozzle 256 and move the nozzle into an accurately controlled location over the wafer 224 during the etching step of the process. The dispense-arm design is not particularly restrictive. It can move down from above the wafer, in from the side, swing in from the edge, rotate down from above, or any combination of these movements. However, the location of the nozzle is preferably reproducibly accurate to within less than about 0.5 mm (more typically less than about 0.2 mm) so that the entire etched region is mechanically under control. Any suitable pneumatic actuator, solenoid, motor controlled gear, or servo controlled motor can activate the arm. The dispense-arm should move the dispense nozzle accurately to the edge of the wafer and move the nozzle out of the way to allow the wafer to be transferred into and out of the chuck. The materials of construction should be resistant to the particular chemical etching solution used. If the preferred etchant disclosed herein is used, certain stainless steels (e.g. 303, 625, 316L etc.), ceramics ($Al_2O_3$, zirconia), Tantalum, and plastic coated metals (polypropylene, polyethylene, PTFE, PVDF) are good choices because they will resist chemical attack, and have sufficient mechanical strength (without creep or flow) to maintain the necessary stringent mechanical tolerances. Similar design considerations hold for the wafer chuck.

Figure 4A:
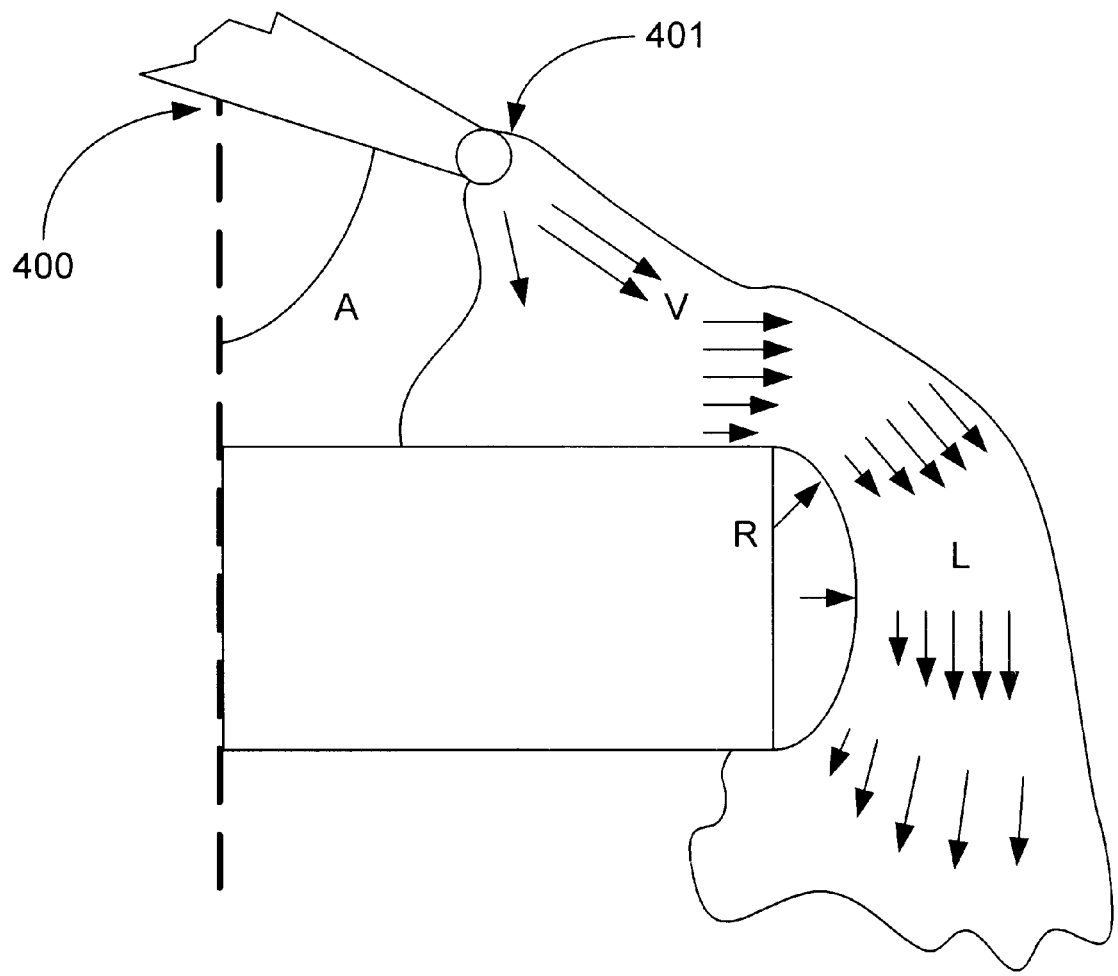
FIG. 4A is a schematic illustration of etchant being delivered to a wafer edge bevel via an etchant dispensing nozzle in a manner that constrains the etchant to the edge bevel region of the wafer.

FIG. 4A schematically shows a nozzle 400 delivering etchant to the front of the wafer for EBR. Relevant parameters for defining the desired etchant flow regime include (i) the thickness of the fluid stream (L), which is essentially determined by the diameter of the nozzle, (ii) the radius of curvature of the wafer (R), and (iii) the radial velocity of the fluid stream (V), which is determined by the radial component of the etchant's exit velocity from the nozzle and to some degree the centripetal acceleration from rotation of the wafer. In a plane containing the normal to the wafer, the nozzle 401 may be angled by A degrees (generally between about 30 to 70 degrees) with respect to the normal of the wafer. The component of the etchant's exit velocity from the slot nozzle in the plane of the wafer is thus the product of the total exit velocity and sin(A). The viscosity ($\mu$) and density ($\rho$) of the etchant fluid also contribute to the flow regime function. The nozzle also is angled rotationally at 0 to 90 degrees with respect to the wafer tangent in the plane of the wafer.

Figure 4B:
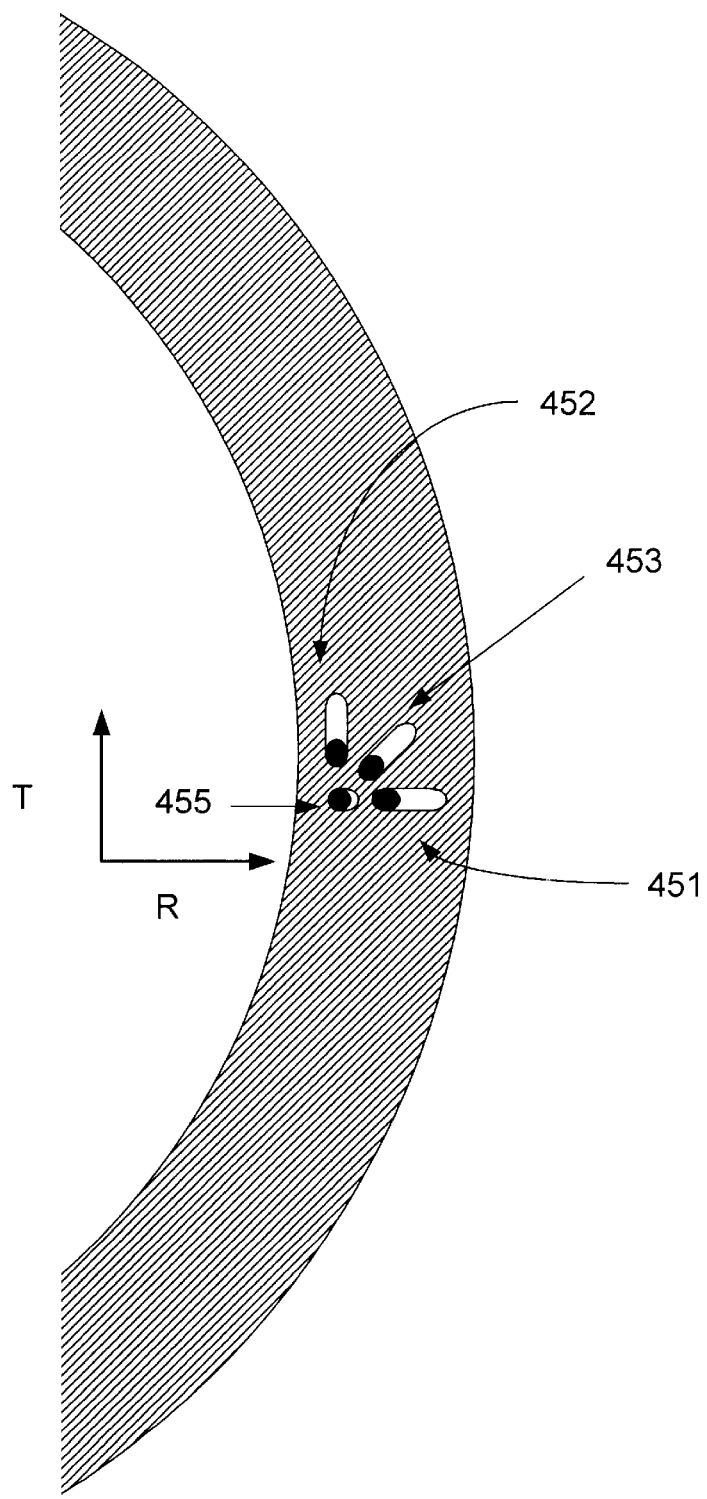
FIG. 4B is a top view of a wafer on which etchant is delivered at a controlled orientation via an etchant delivery nozzle.

FIG. 4B schematically shows a nozzle at four different orientations with respect to a wafer. Each orientation differs from the others in its angle with respect to the wafer's tangent and/or its angle with respect to the wafer's normal (the "z-direction" out of the plane of the page). Considering first the radial/tangential angle (in the plane of the wafer), if the nozzle is angled purely in the radial direction R (90 degrees with respect to the wafer tangent), then it will deliver etchant fluid with a radial angle as shown by nozzle 451. And if the nozzle is angled purely in the tangential direction T (0 degrees with respect to the wafer tangent), then it will deliver etchant fluid with a tangential angle as shown by nozzle 452. The nozzle can and often is angled somewhere between the purely radial and purely tangential directions as illustrated by nozzle 453. As explained, the nozzle orientation can also vary with respect to the wafer normal. Each of nozzles 451, 452, and 453 is angled to the same degree with respect to the wafer normal. Nozzle 455, however, is more steeply angled toward the normal.

As mentioned, the three flow regimes of interest include (i) edge beading, where surface tension forces dominate the behavior of the fluid, (ii) viscous flow, where viscous forces predominate, and (iii) inertial, where inertial forces predominate and the fluid tends to spray. Several experimental observations and calculated trends were made. Larger nozzles and high flow velocities lead to thicker fluid films with more inertia, which tend to fly off the edge of the wafer rather than wrap around the side and back. Combinations of low flow, low rotation, and a wide nozzle result in films that bead at the edge, and sporadically weep from the edge to the back, where they fly off in spurts. A high rotation rate results in very short etchant/surface exposure times and the etchant flying off the front surface (not wetting the sides and back). The experiments and calculations indicate that the thickness of the applied etchant stream should be approximately the same size or smaller than the radius of curvature of the wafer edge. There are a range of flow rates (fluid velocities) and rotation rate that are effective in producing the required viscous flow conditions. Generally, lower flow rates were effective with higher rotation rates and vice versa.

The three flow regimes can be approximately correlated to values of a dimensionless number given by $\mu R/VL^2\rho$. The parameters of this dimensionless number were discussed above in conjunction with FIG. 4A. Using this dimensionless number, numbers above about 0.001 correspond to the edge beading regime, numbers below about 0.0001 correspond to the inertial regime, and numbers in between these correspond to the viscous flow regime.

Edge beading is not desirable for practicing the invention because in this regime the fluid forms in droplets rather than evenly flowing over the surface of the wafer. In addition, the movement of such droplets is somewhat unpredictable, and they can flow in from the front edge of the wafer, where the fluid is dispensed from the nozzle, back toward the center. The inertial regime is undesirable because in this regime the fluid tends to "fly off" the front edge of the wafer, due to the radial component of the fluid's velocity, rather than flowing over the side edge. This radial velocity is a result of the exit velocity of the fluid from the nozzle and to a smaller degree the centripetal acceleration of the rotating wafer. The viscous regime is the regime one wishes to operate in because in this regime the fluid evenly covers the front edge of the wafer where the etchant is applied. The viscous fluid also flows over the side edge and to some degree the back edge of the wafer due to the radial component of the fluid's velocity.

Using typical etchant solutions, such as the preferred $H_2SO_4$ and $H_2O_2$ solution described below, it has generally been found that the thickness of the etchant stream as delivered to the wafer should be about the same size or slightly smaller than the radius of curvature of the wafer. Using the preferred etchant, and processing a standard wafer of 200 millimeters diameter, 0.75 millimeters thickness and 0.15 millimeter radius of curvature, the following parameters were found to have worked well: a nozzle diameter of between about 0.1 and 1.0 millimeters, a wafer rotation rate of between about 100 and 500 rpm, an exit velocity of between about 40 and 400 cm/sec, a angle for the nozzle of 30 to 70 degrees from the normal of the wafer, and a rotation angle for the nozzle of about 0 to 90 degrees with respect to the direction of rotation (the tangential direction, T, of FIG. 4B). It is generally desirable to have the nozzle located as close to the wafer as mechanically practical. Further, the location of the nozzle with respect to the wafer edge, combined with its location above the wafer, determines the etching region which is dependent on the particular application. It has been found that the EBR works well when the nozzle exit is about 0.5 to 5 millimeters above the surface of the wafer, and about 0 to 5 millimeters inside its outer edge. The nozzle tube generally should be narrow and long enough to ensure that the fluid exits in a stream that stays roughly parallel before it hits the wafer.

The rotation rates specified herein were determined through experimentation and calculation, specifically for a 200 millimeter wafer part size and specific viscosity of etchant. However, the invention is not specific to that part size or etchant viscosity. Similar experiments and calculations can be performed to optimize the nozzle size, viscosity, flow conditions and rotation rates for other wafer sizes. The appropriate rotation rate for other size wafers can be estimated by maintaining the same centrifugal acceleration ($v^2/r$). Since the tangential velocity is $v=2\pi\omega r/60$ ($\omega$ is the rotation rate in rpm, r is the wafer radius in cm, v is the velocity in cm/sec), the centrifugal acceleration is given by $a_c=(2\pi\omega/60)^2 r$. Therefore, neglecting viscous forces and time of flight considerations, the appropriate scaling is therefore $r_1/r_2=\omega_2^2/\omega_1^2$.

The nozzle hole diameter should be optimized along with the flow velocity and rotation rate to apply a continuous film of fluid onto the wafer. Maintaining the nozzle hole diameter over a fixed potion of nozzle length is necessary to develop an approximately parallel (non-diverging) exiting fluid flow profile. The fluid nozzle impingement imparts a sufficiently large radial velocity component so that the fluid will rapidly flow around the wafer edge. Preferably, the nozzle shape is tubular. In a specific embodiment, the nozzle is tubular and about 0.5 to 1 millimeter in length.

In an alternative embodiment, the nozzle has a slot shape. If a slot nozzle is used, its length should be determined with reference to the width of the etched region (ring) that is to be produced. The slot width should be small enough so as to minimize chemical usage, splashing of etchant, and beading of the dispensing volume (avoiding the dispense having discrete drops rather than a stream). Typical slot nozzles tested that were found to be effective were about 2–4 millimeters in length, allowing application of etchant over 1–5 mm of the wafer edge. Useful slot widths were in the range of about 0.1–0.3 millimeters.

Keep in mind that a large tube (dispensing spray diameters approaching the dimensions of the edge to be etched) could be used, but would not be as efficient as the approaches described here because of the large amount of fluid needed. The use of the larger flow volume near the rotating chuck cams and arms also increases the propensity for splashing back onto the frontside device areas of the wafer as well. The disclosed design enables controlled dispensing of the etchant from the top of the wafer, over the side, to the back edge, and even controlled removal of the metal from the underside edge of the wafer, without physically touching the wafer and thereby contacting the active surface.

Various considerations influence the choice of a liquid etchant. As mentioned above, the liquid etchant should etch the unwanted metal rapidly at room temperature (e.g., >400 Å/sec). But, it should not aggressively attack the mechanical and electrical components of the etch system. Nor should it generate dangerous by-products during the etching reaction. Preferably, the components of the liquid etchant should include only those materials readily available in normal integrated circuit manufacturing facilities. Other beneficial properties of a liquid etchant include a long shelf life (preferably without stabilizers), a consistent etching rate over time, low cost, and environmental friendliness.

Preferably, the liquid etchant includes an acid and oxidizer. Examples of acids that are useful include sulfuric acid, hydrohalic acids, chromic acid and nitric acid. A preferred etchant for copper EBR is a solution of $H_2SO_4$ (sulfuric acid) and $H_2O_2$ (hydrogen peroxide) in water. A preferred composition of the etchant is 1.4% to 10% $H_2SO_4$ by weight (preferably 2.5% to 7.5%) and 3.5% to 7.5% $H_2O_2$ by weight (preferably 3.5% to 6.5%).

It has been found that this relatively dilute mixture of hydrogen peroxide and sulfuric acid provides an etchant with an excellent rate of copper etch. In storage, the etchant maintains a sufficiently high etch rate for over a month. Alternatively, dilute (about 2–15% by weight) acid and peroxide can be stored in separate containers and mixed in a small tank for short-term storage prior to use, or mixed on-line just prior to their use. There is an exothermic release with the mixing, but it is small at these dilute concentrations. Either of these mixing approaches is effective and preferred, since sulfuric acid is a stable compound, and low concentration hydrogen peroxide (e.g., <10%) can be safely stored for over a year with stabilizers well-known in the art. A system and method for in-line mixing and delivery of this preferred etchant is described in U.S. Pat. No. 6,333,255, previously incorporated by reference. Processing of the etchant after use is not difficult and is generally compatible with waste-treatment methods that are used to process copper electroplating solutions as well.

While sulfuric acid and hydrogen peroxide work well in these capacities, the invention is not so limited. Note that if an oxidant other than hydrogen peroxide is used, some of the precautions described herein against generating oxygen bubbles can be eliminated. Also, if an acid other than sulfuric acid is used, some of the precautions against the exothermic mixing reaction can be eliminated. Two possible, but less preferred, etchant includes $S_2O_8^{-2}$ (peroxydisulfate) and concentrated $HNO_3$ (~30% in water), which is described in U.S. Pat. No. 5,486,234, which is herein incorporated by reference in its entirety.

Generally, the liquid etchant should have physical properties compatible with the etching system. The viscosity and density should allow easy delivery onto the semiconductor wafer in a desired flow regime (e.g., a viscous flow regime). It has been found that the fluid properties of the most effective etchants are very similar to those of water (e.g., surface tension, contact angle, and viscosity). The above-described dilute sulfuric acid/hydrogen peroxide etchant meets this requirement.

Figure 5A:
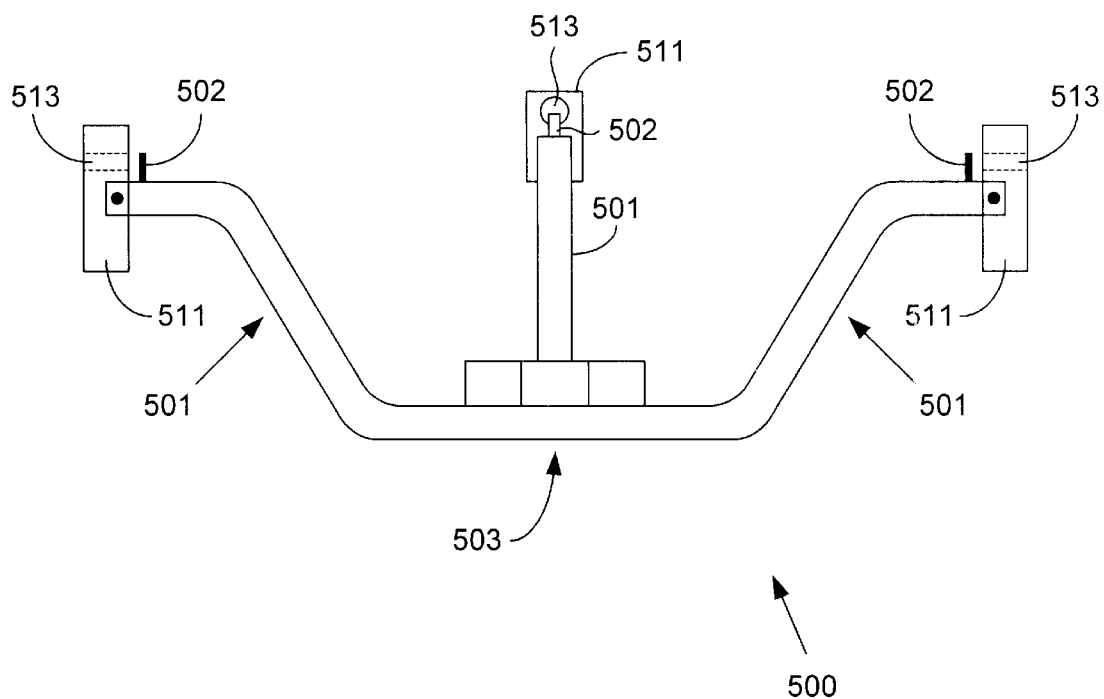
FIG. 5A is a schematic illustration of a simplified wafer chuck with two chuck arms and no alignment and clamping members.
Figure 5B:
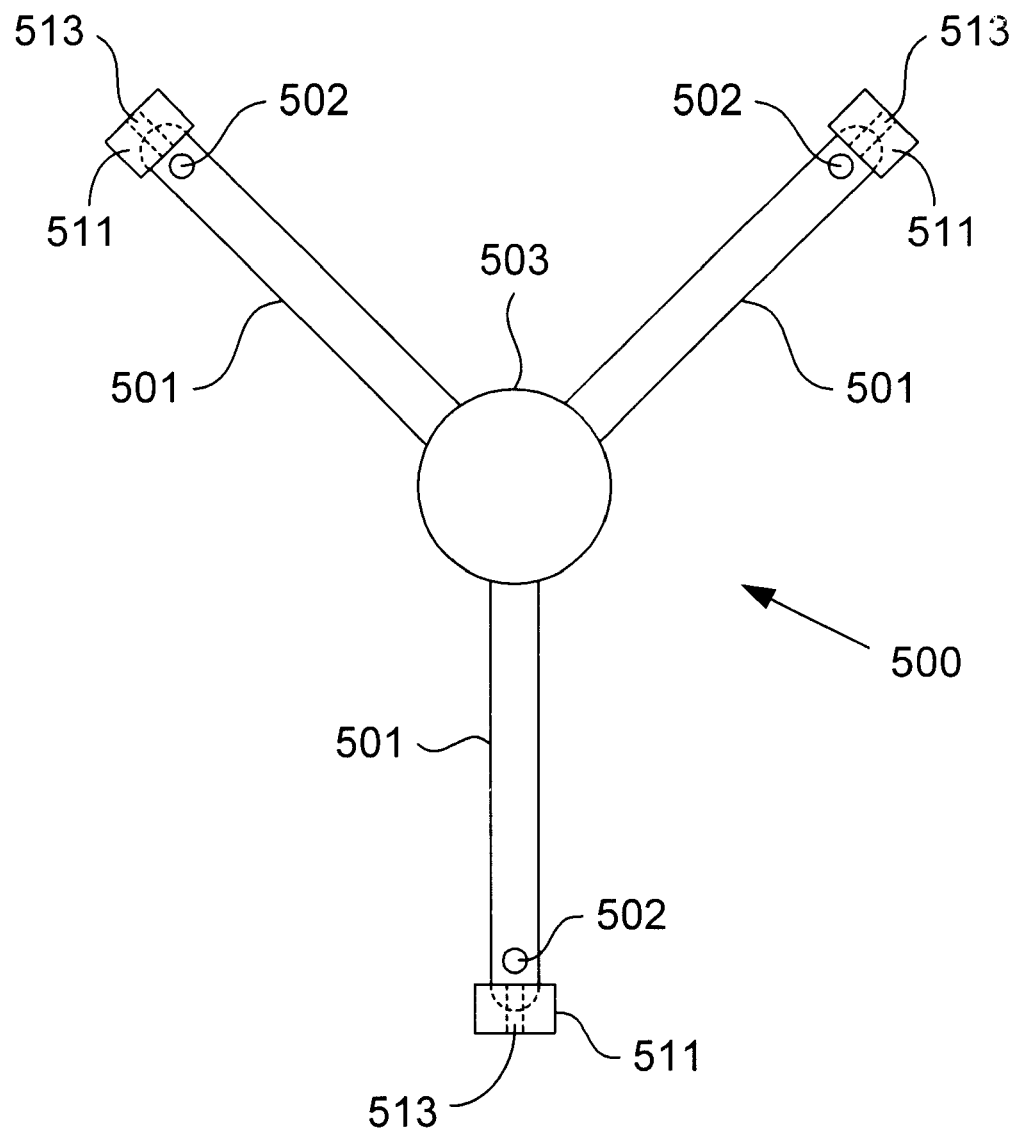
FIG. 5B is a top-view schematic illustration of a wafer chuck with three chuck arms, each with an alignment/clamping member at the end.

FIG. 5A is a highly simplified side-view of portions of a wafer chuck 500 that may be used to support and rotate a wafer during EBR. FIG. 5B is a highly simplified top view of the wafer chuck 500. Wafer chuck 500 is shown with three chuck arms 501. The arms are preferably evenly spaced around the center of the chuck. Each chuck arm 501 has a support pin 502 that impinges on the bottom of the wafer (not shown in this figure). The wafer chuck 500 and the wafer rotate about a center of rotation in a base 503. At the end of each arm 501 is an alignment member 511. These are used to facilitate proper alignment of the wafer on chuck 500 as the wafer is delivered to chuck 500. As described later, wafer chucks of this invention are also preferably outfitted with clamping members (not shown in FIGS. 5A and 5B) that hold the wafer in position during high rotation rates. Note that the alignment members 511, each have a through hole 513, which allows etchant and other liquids delivered onto the wafer to flow off the wafer and beyond the chuck, without becoming entrained on the alignment members or other elements of the chuck. Note also that while FIGS. 5A and 5B are shown with only three chuck arms, other embodiments may employ more arms. In one specific embodiment, a wafer chuck of this invention includes six arms, three that have alignment members and another three that have clamping members.

Figure 6A:
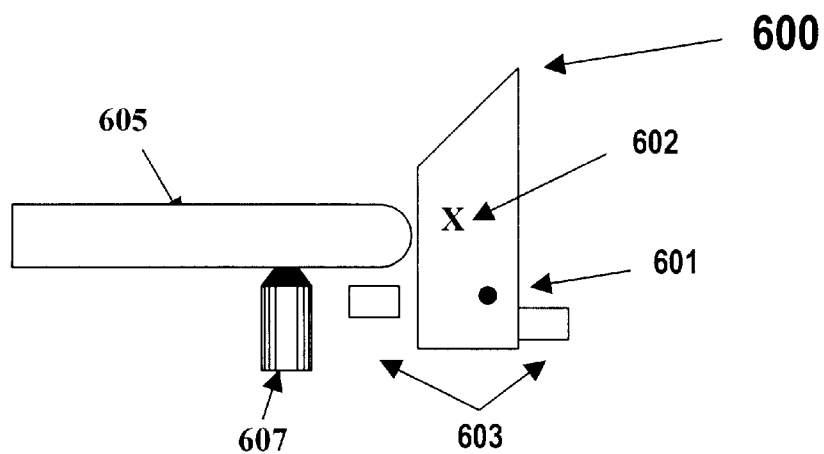
FIG. 6A is a close-up schematic illustration of an alignment member, in this case, an alignment cam.
Figure 6B:
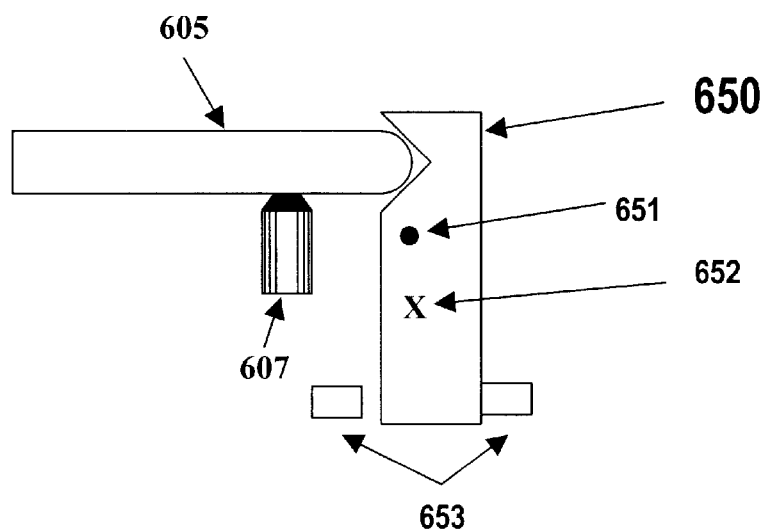
FIG. 6B is a close-up schematic illustration of a clamping member, in this case, a clamping cam.

FIGS. 6A and 6B illustrate examples of an alignment member and a clamping member suitable for use with this invention. The alignment members and clamping members are placed at the end of the chuck arms (not shown) so that they can contact a semiconductor wafer 605 at appropriate stages of the metal etch processes. In the embodiments shown in FIGS. 6A and 6B, both of the members are cams. In these figures, wafer 605 rests on pin 607.

FIG. 6A shows an alignment member 600, that pivots on a rotation pin 601. The alignment member 600 is designed so that its top portion (the portion that contacts the wafer 605) lays inward toward the center of the wafer chuck. It assumes this "alignment position" when the wafer chuck is at rest or is rotating below a certain rotational speed. In this position, the alignment member contacts the edge of wafer 605 when the wafer is placed on the chuck. More specifically, the chuck arms and their associated alignment members are positioned so that they contact a wafer being placed on the chuck in a manner that causes the wafer to precisely slide into correct alignment on the wafer chuck. The alignment member in FIG. 6A is shown in its inner, alignment position.

The center of gravity 602 of alignment member 600 is located above rotation pin 601 so that when member 600 experiences a defined centripetal force (associated with a particular rotational speed), it will swing outward and no longer contacts wafer 605. Thus, this outward, non-alignment position, frees the side edge of the wafer from contact with the alignment member. Then EBR can be performed unobstructed by the alignment member 600 so that the liquid etchant can freely flow over all regions the side edge. Rotation stops 603 are used to prevent alignment member 600 from pivoting beyond its alignment and non-alignment positions. In a preferred embodiment, the top of the alignment member is sloped inward, as illustrated, so that a wafer placed slightly off-center will slide downward and inward toward its aligned position in the center of the wafer chuck.

FIG. 6B shows a clamping member 650, which is a cam that pivots on a rotation pin 651. Clamping member 650 is designed so that it rests in an outward, non-clamping position when the wafer chuck is at rest or rotating below a certain rotational speed. In this position, the clamping member does not contact the edge of the wafer. The center of gravity 652 of the clamping member is placed below the rotation pin so that upon exceeding the desired rotational speed, its upper portion will swing inward due to the direction of the centripetal force on the clamping member. This is the inward, clamping position, and is shown in FIG. 6B. In this position, the clamping member contacts the edge of the wafer. The clamping member is typically used to clamp the wafer at very high rotational speeds (when the wafer is being dried for example). Rotation stops 603 are used to constrain clamping member 650 to its clamping and non-clamping positions.

The rotational speed at which the alignment member swings outward to free the wafer must be slightly below the EBR etch speed, which is 350 to 500 rpm in a preferred embodiment. The rotational speed at which the clamping member swings inward to clamp the wafer for drying is typically at or slightly below the drying speed, which is 750 to 2000 rpm in a preferred embodiment.

It is helpful here to summarize the aligning and clamping steps in the context of the general metal etch process, referring to the flowchart embodiment of FIG. 2B. In step 201, the robot arm places the wafer on the wafer chuck. At this point, the wafer chuck is at rest and the alignment members are in the inward, alignment position. The robot arm should be able to place the wafer in its precise aligned position between the alignment members. If the robot should place the wafer slightly off-center, the inward sloping design of the tops of the alignment members (see FIG. 6A) help guide the wafer to the center.

Next, the pre-rinse 202 and wet-film stabilization 203 steps are performed as the wafer chuck is rotated. At any time after initial alignment, the alignment member can be moved to the outer, non-alignment position, since the frictional force of the support pins will hold the wafer in place, despite the rotation of the wafer chuck. Typically, the alignment member will be designed to pivot to the outward, non-alignment position at just below the EBR etch speed. During the EBR etch 204 and onward, the alignment member remains in the outward, non-alignment position. These steps include the post-EBR rinse 205, back side pre-rinse 206, back-side wet-film stabilization 207, back side etch 208, back-side rinse 209, acid wash 210 and final rinse 211.

In the final blow dry step 212, the wafer chuck is typically rotated at 750 to 2000 rpm to facilitate drying. At these speeds, the friction of the support pins cannot guarantee that the wafer will remain in place. Therefore, at about the lower end of the blow dry speed, about 750 rpm, the clamping members, which heretofore had been in an outward, non-clamping position, now swing inward into the inward, clamping position to insure that the wafer does not move. After the blow dry is completed, the wafer chuck is slowed down, the clamping members swing outward and then the alignment members swing inward. When the wafer chuck reaches a stop, the wafer is ready to be removed for other processing steps or for storage.

Figure 7A:
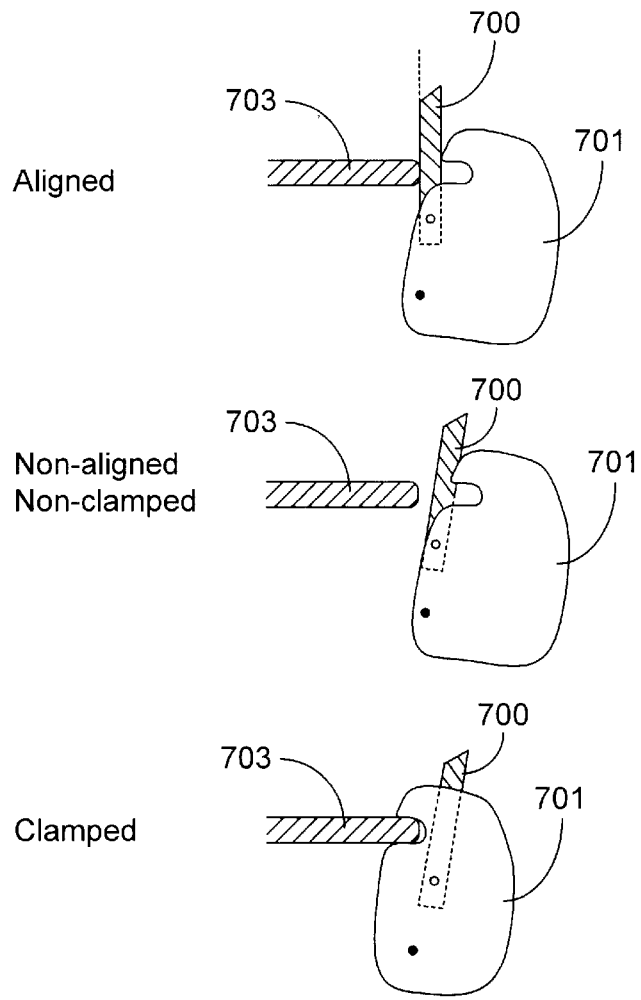
FIG. 7A is a side-view schematic illustration of an alignment member and a clamping member designed to be placed on the same chuck arm, in various positions.

Numerous other embodiments for the alignment and clamping mechanisms are possible. FIG. 7A shows a side-view schematic of a clamping member 700 and an alignment member 701 that are placed on the same chuck arm. FIG. 7A shows the members in three different sets of positions. The top drawing shows alignment member 700 is in the inward, alignment position and clamping member 700 in the outward, non-clamping position. At this point, a wafer 703 can be aligned on the chuck with the aid of alignment member 701 and without interference from clamping member 701. The middle drawing shows both the alignment member and the clamping member in the outward positions. This state exists at low rotational speeds when friction from the wafer chuck pins is adequate to hold the wafer in position. The lower drawing shows the alignment member in its outward, non-alignment position and the clamping member in its inward, clamping position. This state exists when the wafer rotates at very fast rates.

Figure 7B:
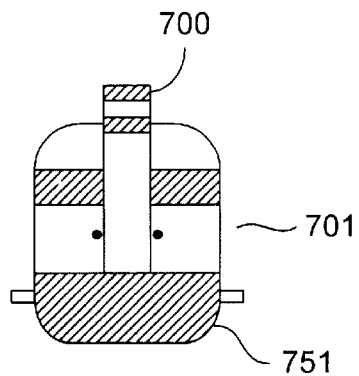
FIG. 7B is front-view schematic illustration of an alignment member and a clamping member designed to be placed on the same chuck arm.

In the embodiment depicted in FIGS. 7A and 7B, the alignment member resides inside the clamping member, as illustrated. In other words, clamping member 701 includes a cavity within which alignment member 700 can pivot (at some rotational speeds). Note that each member pivots on a separate pivot pin. The alignment member and the clamping member function in essentially the same manner as described in the previous embodiment. The principal difference in this embodiment is that the clamping member 750 typically has a cross-member 751 near its bottom that holds the alignment member in its inward alignment position by keeping it upright at low rotational speeds, as illustrated in FIG. 7B. Typically, clamping member 701 will be more massive than alignment member 700, so that the position of clamping member 701 can constrain member 700 at certain rotational speeds. When the wafer chuck is at rest, cross-member 751 holds alignment member 700 in its alignment position. At rather low rotational speeds, clamping member 701 begins to pivot so that its lower portion moves outward and frees alignment member 700 to pivot to a non-alignment position.

Another embodiment for the aligning and clamping functions is to use a single type of member to perform both functions. In this embodiment, the member in designed to be in an outward position that does not contact the wafer until the chuck reaches a high rotational speed (clamping speed). A robot places a wafer in rough alignment on the wafer chuck in step 201, just as in the other embodiments. However, in this embodiment the wafer chuck is immediately spun up to "clamping speed," that is, a high rotational rate of about 750 to 2000 rpm, so that the member swings inward and contacts the wafer. In this manner, the wafer is aligned to the center of the wafer chuck. This embodiment therefore involves the use of a member that is very similar to the clamping members described in previous embodiments in order to align the wafer (and later to clamp it when the wafer chuck again reaches high rotational speed for the drying step). After alignment, the wafer chuck is slowed down to a lower rotational speed to perform EBR steps 202 and onward.

Figure 8A:
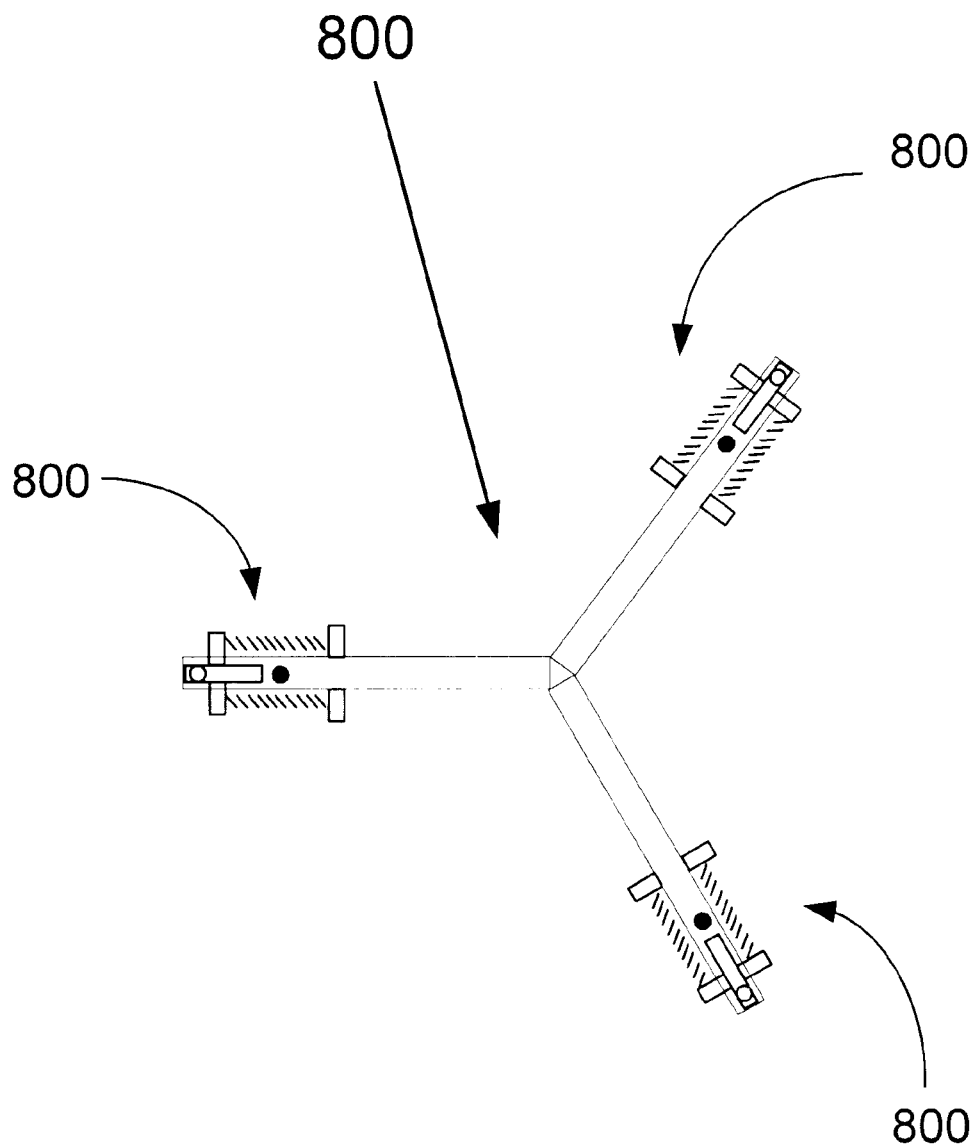
FIG. 8A is a top-view schematic illustration of a wafer chuck with a pneumatic mechanism embodiment.
Figure 8B:
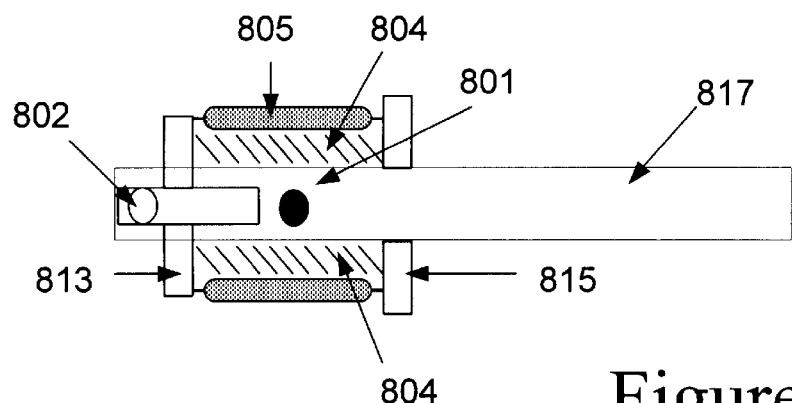
FIG. 8B is a top-view schematic illustration of a pneumatic mechanism embodiment.
Figure 8C:
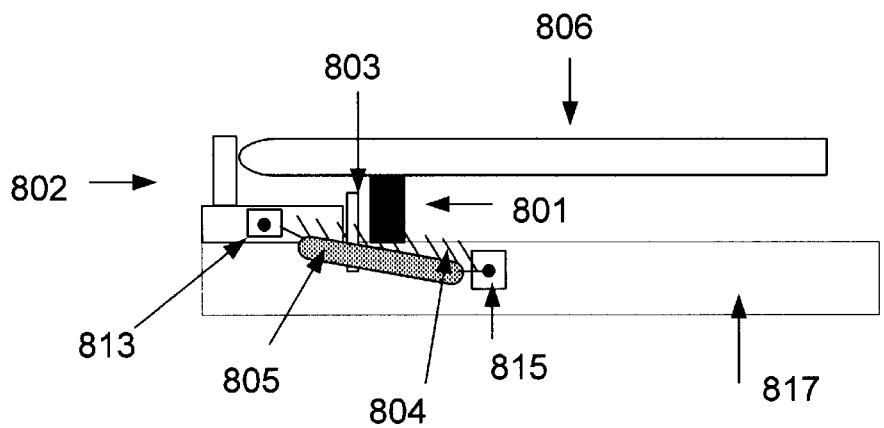
FIG. 8C is a side-view schematic illustration of a pneumatic mechanism embodiment in the closed alignment/clamping position.
Figure 8D:
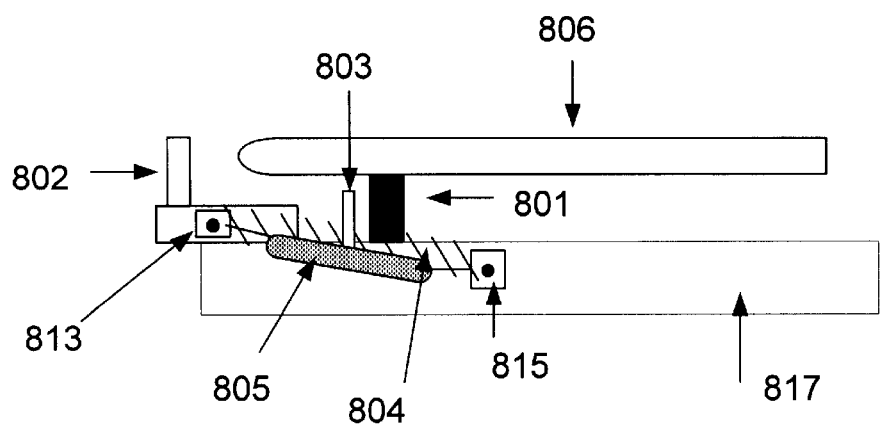
FIG. 8D is a side-view schematic illustration of a pneumatic mechanism embodiment in the open position.

Another embodiment for the alignment and clamping mechanisms is an actuated, pneumatic-pressure embodiment. In this embodiment, one pneumatic mechanism will typically serve both alignment and clamping functions by using a contact pin that contacts the edge of the wafer. FIG. 8A is a top-view schematic of a chuck 803 having three chuck arms 800 with pneumatic mechanisms 811 at their ends. FIGS. 8B–8D show a pneumatic mechanism up close, both from a top-view (FIG. 8B) and a side view (FIGS. 8C and 8D). As shown, the pneumatic mechanism includes a support pin 801 for the wafer 806, and a contact pin 802 that contacts the edge of the wafer. Typically, the alignment position and the clamping position of the pneumatic mechanism will be the same, and will be defined by a stop 803 (against which pin 802 rests in the clamping and alignment positions). The pneumatic member is held in the inner, alignment/clamping position by a set of springs 804 or some other force-generating mechanism. In the depicted embodiment, springs 804 are anchored at one end to an anchor 813 on contact pin 802 and at the other end to an anchor 815 to the wafer chuck arm 817.

FIG. 8C shows the pneumatic member in the closed, alignment/clamping position. FIG. 8D shows the pneumatic member in the open position. The operation of the pneumatic member in the context of the EBR process is the same as it was in the above-described embodiments in terms of when it should be in the should be in the alignment position, clamping position and open position (in this embodiment, the alignment position and the clamping position being the same. In the alignment/clamping position shown in FIG. 8C, little or no pneumatic pressure is applied and contact pin 802 is held against stop 803 and the edge of wafer 806. In the open position, pneumatic pressure is applied and causes pin 802 to move outwardly, thereby disengaging wafer 806. The pneumatic pressure is applied by one or more pneumatic actuators 805.

Figure 9A:
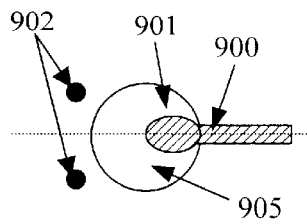
FIG. 9A is a schematic illustration of an external alignment embodiment with a wafer balanced on top of a robot arm.
Figure 9B:
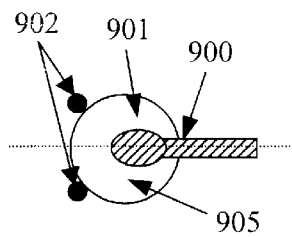
FIG. 9B is a schematic illustration of an external alignment embodiment with a wafer in contact with alignment pins and a robot arm sliding underneath the wafer.
Figure 9C:
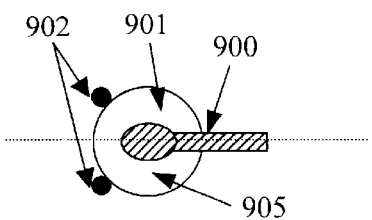
FIG. 9C is a schematic illustration of an external alignment embodiment a wafer precisely aligned with respect a robot and ready for placement in an etching module.

An alternative embodiment for alignment is a pre-alignment procedure that is similar to procedures used with wet-environment silicon wafer-handling robots, such as the robots manufactured by Brooks Automation of Chelmsford, MA. In this embodiment, a robot arm with a vacuum cup end-effector is used to pick up and place the wafer in precise alignment in the wafer chuck, provided that the wafer itself has been precisely attached to the robot arm in the correct position. Such a robot arm 900 with a vacuum-cup end-effector 901 is shown in FIGS. 9A–9C.

In this embodiment, a wafer 905 is initially picked up by robot arm 900 using vacuum cup end-effector 901, either from storage in a wafer cassette, from an electrofill module, or from some other source. The robot arm 900 places the cup under (or on top of) wafer 905 and activates the vacuum in order to attach the wafer. The robot arm 900 then moves the wafer to an external alignment apparatus, which typically has two alignment pins 902. The process to this point is depicted in FIG. 9A. The vacuum is then released, but because the robot arm 900 remains in frictional contact with wafer 905 via end effector cup 901, the wafer 905 remains balanced on the cup. The robot arm then continues to move toward alignment pins 902 until the wafer bumps up against the alignment pins. At this point, the wafer is prevented from moving, but the robot arm can still continue to slide under the wafer. The process to this point is depicted in FIG. 9B. When robot arm 900 reaches a predetermined position with respect to alignment pins 902, it stops. Wafer 905 is now precisely aligned with respect to the robot arm at a desired position. The alignment process to this point is depicted in FIG. 9C. The process till not can be carried out in a separate pre-alignment module or in a pre-alignment section of the etching module. The robot arm then moves the wafer to the wafer chuck (with or without the vacuum being reactivated) for alignment. In summary, FIGS. 9A–9C show the pre-alignment procedure at three stages. The first is when the wafer is being balanced on the robot arm and moved toward the alignment pins. The second is when the wafer has contacted the alignment pins and the robot arm is sliding underneath it. The third is when the robot arm has stopped moving, and the wafer is precisely aligned with respect to the robot arm.

The robot arm moves to a precise point in the EBR module and releases the wafer. Because the wafer is also now precisely aligned with respect to the robot arm due to the external alignment procedure, it also precisely aligned on the wafer chuck. Various clamping embodiments, as described above, can be used with this alignment embodiment.

While this invention has been described in terms of a few preferred embodiments, it should not be limited to the specifics presented above. Many variations on the above-described preferred embodiments, may be employed. Note, for example, that other metal deposition processes (e.g., non-copper and/or non-PVD processes) frequently present the same problems as outlined above for the copper seed layer PVD process. In each case, unwanted metal must be removed after the deposition process. Further, unwanted metal may have to be removed from locations other than the edge of the semiconductor wafer. The present invention may be employed to etch unwanted metal in these cases. Therefore, the invention should be broadly interpreted with reference to the following claims.

What is claimed is:

1. A wafer chuck for a module that processes semiconductor wafers, the wafer chuck comprising:
    at least one alignment member that assumes an alignment position when the chuck is rotating below an alignment speed, and assumes a non-alignment position when the chuck is rotating at or above the alignment speed, wherein the alignment member in the alignment position aligns the wafer by constraining the wafer at its edge and does not constrain the wafer in the non-alignment position; and
    at least one clamping member that assumes a non-clamping position when the chuck is rotating at or below a clamping speed, and assumes a clamping position when the chuck is rotating above the clamping speed, wherein the clamping member in the clamping position clamps the wafer by constraining the wafer at its edge and does not constrain the wafer in the non-clamping position.

2. The wafer chuck of claim 1 wherein the module etches metal from the semiconductor wafer.

3. The wafer chuck of claim 1, wherein at least one of the clamping members is a cam whose position is determined by centripetal force associated with rotation of the chuck.

4. The wafer chuck of claim 1, wherein at least one of the alignment members is a cam whose position is determined by centripetal force associated with rotation of the chuck.

5. The wafer chuck of claim 1, further comprising a plurality of arms, each attached to at least one alignment member.

6. The wafer chuck of claim 5, wherein one or more of the arms have both a clamping member and an alignment member.

7. The wafer chuck of claim 1, wherein at least one of the clamping members and at least one of the alignment members are provided on a single arm of the wafer chuck and wherein the clamping member helps hold the alignment member in the alignment position when the chuck is rotating below a certain speed and releases the alignment member into the non-alignment position when the chuck is rotating at or above a certain speed.

8. The wafer chuck of claim 1 wherein a pneumatic mechanism serves as at least one of the alignment members and at least one of the clamping members, and the alignment position and the clamping position are the same and the non-alignment and the non-clamping position are the same.

9. The wafer chuck of claim 1, wherein at least one of the clamping members is a cam comprising a pivot pin about which the cam rotates as the rotation speed of the wafer chuck changes.

10. The wafer chuck of claim 1, wherein at least one of the alignment members is a cam comprising a pivot pin about which the cam rotates as the rotation speed of the wafer chuck changes.

11. The wafer chuck of claim 1, wherein a single mechanism serves as both an alignment member and a clamping member, and the alignment position and the clamping position are the same and the non-alignment and the non-clamping position are the same.

12. A wafer chuck for a module that processes semiconductor wafers, the wafer chuck comprising:
    at least one alignment member that assumes an alignment position when the chuck is rotating at or below an alignment speed, and assumes a non-alignment position when the chuck is rotating above the alignment speed, wherein the alignment member in the alignment position aligns the wafer by constraining the wafer at its edge and does not constrain the wafer in the non-alignment position.

13. The wafer chuck of claim 12 wherein the module etches metal from the semiconductor wafer.

14. The wafer chuck of claim 12, further comprising a plurality of arms each having at least one of the aligning members.

15. A wafer chuck for a module that processes semiconductor wafers, the wafer chuck comprising:
    at least one alignment member that assumes an alignment position when the chuck is rotating below an alignment speed, and assumes a non-alignment position when the chuck is rotating at or above the alignment speed, wherein the alignment member in the alignment position aligns the wafer by constraining the wafer at its edge and does not constrain the wafer in the non-alignment position;
    at least one clamping member that assumes a non-clamping position when the chuck is rotating at or below a clamping speed, and assumes a clamping position when the chuck is rotating above the clamping speed, wherein the clamping member in the clamping position clamps the wafer by constraining the wafer at its edge and does not constrain the wafer in the non-clamping position; and
    at least one of the clamping members is a cam whose position is determined by centripetal force associated with rotation of the chuck.

16. The wafer chuck of claim 15, wherein the module etches metal from the semiconductor wafer.

17. The wafer chuck of claim 15, further comprising a plurality of arms, each attached to at least one alignment member.

18. The wafer chuck of claim 17, wherein one or more of the arms have both a clamping member and an alignment member.

19. The wafer chuck of claim 15, wherein at least one of the clamping members and at least one of the alignment members are provided on a single arm of the wafer chuck and wherein the clamping member helps hold the alignment member in the alignment position when the chuck is rotating below an alignment speed and releases the alignment member into the non-alignment position when the chuck is rotating at or above the alignment speed.

20. The wafer chuck of claim 15, wherein a pneumatic mechanism serves as at least one of the alignment members and at least one of the clamping members, and the alignment position and the clamping position are the same and the non-alignment and the non-clamping position are the same.

21. The wafer chuck of claim 15, wherein a single mechanism serves as both an alignment member and a clamping member, and the alignment position and the clamping position are the same and the non-alignment and the non-clamping position are the same.

22. A wafer chuck for a module that processes semiconductor wafers, the wafer chuck comprising:

at least one alignment member that assumes an alignment position when the chuck is rotating below an alignment speed, and assumes a non-alignment position when the chuck is rotating at or above the alignment speed, wherein the alignment member in the alignment position aligns the wafer by constraining the wafer at its edge and does not constrain the wafer in the non-alignment position;

at least one clamping member that assumes a non-clamping position when the chuck is rotating at or below a clamping speed, and assumes a clamping position when the chuck is rotating above the clamping speed, wherein the clamping member in the clamping position clamps the wafer by constraining the wafer at its edge and does not constrain the wafer in the non-clamping position; and at least one of the alignment members is a cam whose position is determined by centripetal force associated with rotation of the chuck.

23. The wafer chuck of claim 22, wherein the module etches metal from the semiconductor wafer.

24. The wafer chuck of claim 22, further comprising a plurality of arms, each attached to at least one alignment member.

25. The wafer chuck of claim 24, wherein one or more of the arms have both a clamping member and an alignment member.

26. The wafer chuck of claim 22, wherein at least one of the clamping members and at least one of the alignment members are provided on a single arm of the wafer chuck and wherein the clamping member helps hold the alignment member in the alignment position when the chuck is rotating below an alignment speed and releases the alignment member into the non-alignment position when the chuck is rotating at or above the alignment speed.

27. The wafer chuck of claim 22, wherein a pneumatic mechanism serves as at least one of the alignment members and at least one of the clamping members, and the alignment position and the clamping position are the same and the non-alignment and the non-clamping position are the same.

28. The wafer chuck of claim 22, wherein a single mechanism serves as both an alignment member and a clamping member, and the alignment position and the clamping position are the same and the non-alignment and the non-clamping position are the same.

* * * * *